(12) United States Patent
Goto et al.

(10) Patent No.: US 7,932,564 B2
(45) Date of Patent: Apr. 26, 2011

(54) SEMICONDUCTOR DEVICE AND METHOD OF FABRICATING THE SAME

(75) Inventors: Masakazu Goto, Kanagawa (JP); Makoto Fujiwara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 12/146,667

(22) Filed: Jun. 26, 2008

(65) Prior Publication Data

US 2009/0008716 A1 Jan. 8, 2009

(30) Foreign Application Priority Data

Jun. 27, 2007 (JP) ................. 2007-168639

(51) Int. Cl.
*H01L 27/088* (2006.01)
*H01L 21/8234* (2006.01)

(52) U.S. Cl. .............. 257/368; 257/365; 257/E27.06; 257/E21.626; 438/275

(58) Field of Classification Search .............. 257/368
See application file for complete search history.

(56) References Cited

U.S. PATENT DOCUMENTS

| | | | |
|---|---|---|---|
| 3,638,039 A * | 1/1972 | Chen et al. ............ | 8/111 |
| 6,563,182 B2 | 5/2003 | Horikawa | |
| 6,911,383 B2 | 6/2005 | Doris et al. | |
| 6,949,768 B1 | 9/2005 | Anderson et al. | |
| 7,202,535 B2 | 4/2007 | Goldbach et al. | |
| 2005/0280104 A1 | 12/2005 | Li | |
| 2006/0043497 A1 | 3/2006 | Kimizuka et al. | |
| 2006/0192258 A1 | 8/2006 | Tsuchiya et al. | |
| 2006/0275988 A1 | 12/2006 | Yagishita et al. | |
| 2006/0292784 A1 * | 12/2006 | Sohn et al. ............. | 438/201 |
| 2007/0034902 A1 | 2/2007 | Kamimuta et al. | |
| 2007/0045748 A1 * | 3/2007 | Booth et al. ............ | 257/369 |
| 2007/0075351 A1 | 4/2007 | Schulz et al. | |
| 2007/0099353 A1 * | 5/2007 | Thean et al. ............ | 438/149 |
| 2007/0128791 A1 * | 6/2007 | Iwaki ..................... | 438/238 |
| 2007/0257320 A1 | 11/2007 | Nabatame et al. | |
| 2008/0128822 A1 * | 6/2008 | Koyama et al. .......... | 257/369 |
| 2008/0214015 A1 * | 9/2008 | Boescke ................. | 438/758 |
| 2008/0303096 A1 * | 12/2008 | Schulz ................... | 257/365 |

FOREIGN PATENT DOCUMENTS

| | | |
|---|---|---|
| JP | 2006-278376 | 10/2006 |
| JP | 2006-339514 | 12/2006 |

(Continued)

OTHER PUBLICATIONS

H. Kawasaki, "Embedded Bulk FinFET SRAM Cell Technology with Planar FET Peripheral Circuit for *hp*32 nm node and beyond", Symposium on VLSI Technology Digest of Techical Papers, 2006 IEEE, pp. 86-87.

*Primary Examiner* — Jarrett J Stark
*Assistant Examiner* — Lawrence Tynes, Jr.
(74) *Attorney, Agent, or Firm* — Oblon, Spivak, McClelland, Maier & Neustadt, L.L.P.

(57) ABSTRACT

A semiconductor device according to an embodiment includes: a fin type MOSFET having a first gate electrode, and a first gate insulating film for generating Fermi level pinning in the first gate electrode; and a planar type MOSFET having a second gate electrode, and a second gate insulating film for generating no Fermi level pinning in the second gate electrode, or generating Fermi level pinning weaker than that generated in the first gate electrode in the second gate electrode.

16 Claims, 13 Drawing Sheets

FOREIGN PATENT DOCUMENTS

| | | |
|---|---|---|
| JP | 2007-27743 | 2/2007 |
| JP | 2007-123867 | 5/2007 |
| JP | 2007-158065 | 6/2007 |
| JP | 2008-517464 | 5/2008 |
| WO | WO 2005-020325 A1 | 3/2005 |
| WO | WO 2006/044349 A3 | 4/2006 |

* cited by examiner

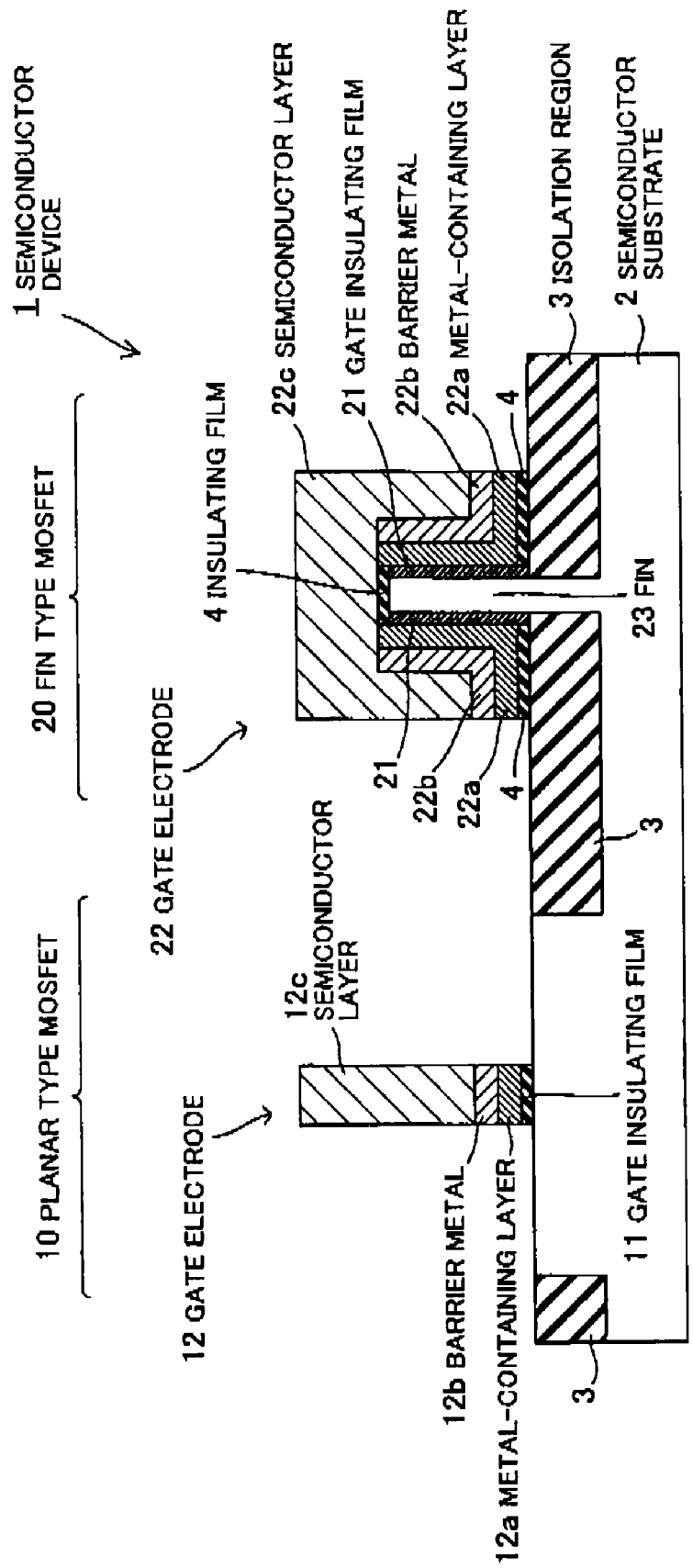

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2007-168639, filed on Jun. 27, 2007, the entire contents of which are incorporated herein by reference.

BACKGROUND

In recent years, an embedded integrated circuit has been proposed in which a fin type metal oxide semiconductor field effect transistor (MOSFET) having less dispersion in a threshold voltage is used in a static random access memory (SRAM), and a planar type MOSFET to which the prior art can be applied is used in any of other circuits. This technique, for example, is described in a non-patent literary document of H. Kawasaki et al.: Symp. on VLSI Tech., pp. 86 and 87, 2006.

BRIEF SUMMARY

A semiconductor device according to one embodiment includes: a fin type MOSFET having a first gate electrode, and a first gate insulating film for generating Fermi level pinning in the first gate electrode; and a planar type MOSFET having a second gate electrode, and a second gate insulating film for generating no Fermi level pinning in the second gate electrode, or generating Fermi level pinning weaker than that generated in the first gate electrode in the second gate electrode.

A semiconductor device according to another embodiment includes: a fin type MOSFET having a first gate insulating film, and a first gate electrode including a first metal-containing layer formed on the first gate insulating film, and a first semiconductor layer formed on the first metal-containing layer; and a planar type MOSFET having a second gate insulating film made of the same material as that of the first insulating film, and a second gate electrode including a second metal-containing layer formed on the second gate insulating film, a barrier metal made of the same material as that of the first metal-containing layer and formed on the second metal-containing layer, and a second semiconductor layer formed on the barrier metal.

A method of fabricating a semiconductor device according to still another embodiment includes: processing a semiconductor substrate, thereby forming a planar type MOSFET region and a fin type MOSFET region having a fin; forming an insulating film having a property of generating Fermi level pinning in a conductive material adjacent thereto on each of the planar type MOSFET region and the fin type MOSFET region; making the property of a portion of the insulating film formed on the planar type MOSFET region weaker than that of a portion of the insulating film formed on each of side surfaces of the fin of the fin type MOSFET region; forming a gate material film on the insulating film formed on each of the planar type MOSFET region and the fin type MOSFET region; and processing the insulating film and the gate material film on the planar type MOSFET region and the fin type MOSFET region, thereby forming gate insulating films and the gate electrode in the planar type MOSFET region and the fin type MOSFET region, respectively.

BRIEF DESCRIPTION OF THE DRAWING

FIG. 2 is a cross sectional view when a cut surface taken on line II-II of FIG. 1 of the semiconductor device according to the first embodiment is viewed in a direction indicated by an arrow in the figure;

DETAILED DESCRIPTION

Normally, in the planar type MOSFET, in order to reduce the threshold voltage, a material having a Fermi level located in the vicinity of a band edge of Si is used as a material for a gate electrode. On the other hand, the fin type MOSFET is a fully-depleted transistor and has a double-gate structure. Thus, the responsiveness to application of a gate voltage is higher in the fin type MOSFET than in the planar type MOSFET.

For this reason, in the case where the planar type MOSFET and the fin type MOSFET are embedded in the semiconductor device, when a gate electrode of the fin type MOSFET is made of the same material as that of a gate electrode of the planar type MOSFET, the threshold voltage is too small, and thus it is feared that an off-state leakage current is caused to flow. For this reason, the prior art involves a problem that the gate electrodes of the fin type MOSFET and the planar type MOSFET must be individually made of the materials having different Fermi levels, respectively, and thus the manufacturing processes are complicated.

Moreover, when a metal gate electrode is used as the gate electrode, a process for peeling off the gate electrode, and replacing the gate electrode thus peeled off with another one is carried out in one transistor in order to individually make the gate electrodes of the fin type MOSFET and the planar type MOSFET. This causes a problem that the gate insulating film of the one transistor is damaged.

First Embodiment

Figure 1:
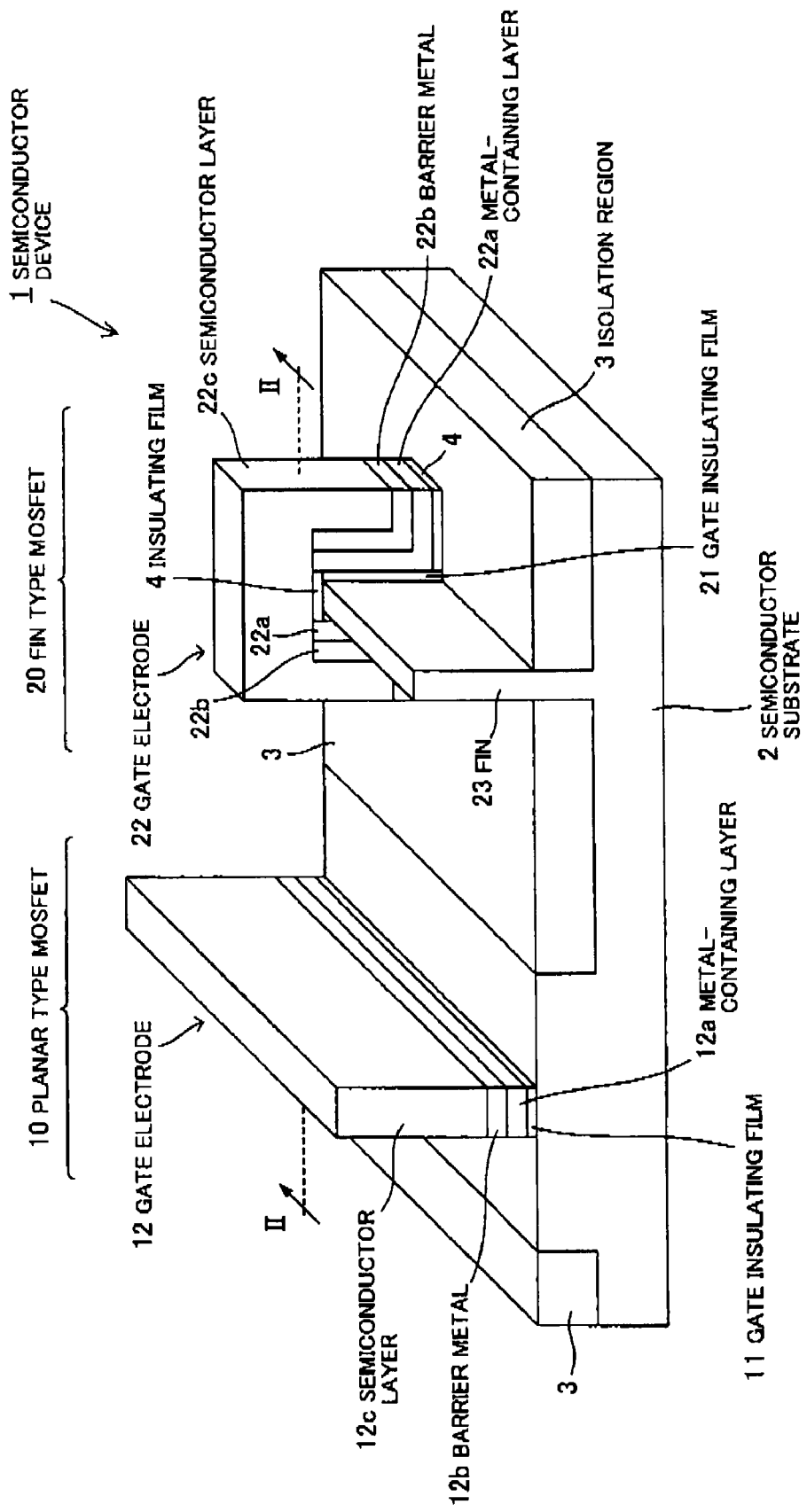
FIG. 1 is a perspective view of a semiconductor device according to a first embodiment.

FIG. 1 is a perspective view of a semiconductor device according to a first embodiment. Also, FIG. 2 is a cross sectional view when a cut surface taken on line II-II of FIG. 1 is viewed in a direction indicated by an arrow.

A semiconductor device 1 is schematically structured to have a planar type MOSFET 10 and a fin type MOSFET 20 which are formed on a semiconductor substrate 2, and an isolation region 3 through which the planar type MOSFET 10 and the fin type MOSFET 20 are electrically isolated from one another.

The planar type MOSFET 10 has a gate electrode 12 formed on the semiconductor substrate 2 through a gate insulating film 11. The gate electrode 12 includes a metal-containing layer 12a formed on the gate insulating film 11, a barrier metal 12b formed on the metal-containing layer 12a, and a semiconductor layer 12c formed on the barrier metal 12b. It is noted that although not illustrated, source/drain regions are formed in regions, between which the gate electrode 12 is located, in the vicinities of an surface of the semiconductor substrate 2, respectively.

In addition, although not illustrated, a well region may be formed in a region, of the semiconductor substrate 2, below the planar type MOSFET 10. Also, although not illustrated, gate sidewalls or offset spacers may be formed on side surfaces of the gate electrodes 12, respectively.

The fin type MOSFET 20 includes a fin 23 formed on the semiconductor substrate 2, and a gate electrode 22 formed so as to hold both side surfaces of the fin 23 between its opposite portions through a gate insulating film 21. The gate electrode 22 includes a metal-containing layer 22a formed on the gate insulating film 21, a barrier metal 22b formed on the metal-containing layer 22a, and a semiconductor layer 22c formed on the barrier metal 22b. In addition, insulating films 4 is formed between the semiconductor layer 22c of the gate electrode 22 and an upper surface of the fin 23, and between the metal-containing layer 22a of the gate electrode 22 and the isolation region 2, respectively. It is noted that although not illustrated, source/drain regions are formed in regions, within the fin 23, between which the gate electrode 22 is located.

In addition, although not illustrated, a well region may be formed in the fin 23. Also, although not illustrated, gate sidewalls or offset spacers may be formed on side surfaces of the gate electrode 22, respectively.

An Si substrate or the like is used as the semiconductor substrate 2.

The isolation region 3, for example, is made of an insulating material such as $SiO_2$, and has a Shallow Trench Isolation (STI) structure.

The metal-containing layer 12a of the gate electrode 12, and the metal-containing layer 22a of the gate electrode 22 are layers which serve as a metal gate electrode each to prevent the depletion from being generated in the gate electrodes 12 and 22. Thus, the metal-containing layer 12a of the gate electrode 12, and the metal-containing layer 22a of the gate electrode 22 are made of metal-containing materials each having a Fermi level located near a band edge of Si. When each of the metal-containing layer 12a and the metal-containing layer 22a has a n conductivity type, a material, such as TaC or HfB, having a Fermi level near a bottom edge of a conduction band of Si can be used as each of the metal-containing layer 12a and the metal-containing layer 22a. In addition, when each of the metal-containing layer 12a and the metal-containing layer 22a has a p conductivity type, a material, such as WN or RuO, having a Fermi level near top edge of a valence band of Si can be used as each of the metal-containing layer 12a and the metal-containing layer 22a. Also, for the sake of simplicity of the manufacturing processes, the metal-containing layer 12a and the metal-containing layer 22a are preferably made of the same material.

Each of the semiconductor layer 12c of the gate electrode 12, and the semiconductor layer 22c of the gate electrode 22, for example, is made of polycrystalline silicon or polycrystalline silicon germanium containing therein a conductivity type impurity. When each of the semiconductor layers 12c and 22c has the n conductivity type, n-type impurity ions of As, P or the like are used as the conductivity type impurity. On the other hand, when each of the semiconductor layers 12c and 22c has the p conductivity type, p-type impurity ions of B, $BF_2$ or the like are used as the conductivity type impurity. The formation of the semiconductor layers 12c and 22c makes it possible to enhance the coherency with the conventional polycrystalline Si gate electrode process.

The barrier metal 12b of the gate electrode 12, and the barrier metal 22b of the gate electrode 22 are made of materials having properties of being hard to react with the semiconductor layers 12c and 22c, respectively. Thus, the barrier metal 12b and the barrier metal 22b prevent the metal-containing layers 12a and 22a from reacting with the semiconductor layers 12c and 22c, respectively. Each of the barrier metal 12b and the barrier metal 22b, for example, is made of a metal such as Ta, Ti, W, Ru or Co, or a compound thereof such as TaN or TiN. In addition, for the sake of simplicity of the manufacturing processes, the barrier metal 12b and the barrier metal 22b are preferably made of the same material.

It is noted that the barrier metals 12b and 22b are not essential to the gate electrodes 12 and 22, respectively. In addition, the gate electrodes 12 and 22 may have the structures of having only the metal-containing layers 12a and 22a, respectively. Also, the gate electrodes 12 and 22 may have the structures of having only the semiconductor layers 12c and 22c, respectively.

The gate insulating film 21 has the property of generating Fermi level pinning in the metal-containing layer 22a. Here, the Fermi level pinning means a phenomenon that the Fermi level of the gate electrode is pinned to the vicinity of a mid gap of Si from the reasons that atoms in the gate electrode and atoms in the gate insulating film are bonded to each other, and so forth. In this embodiment, the Fermi level of the metal-containing layer 22a is pinned to the vicinity of the mid gap of Si by the gate insulating film 21.

The gate insulating film 21, for example, is made of a High-k material. A Hf system oxide such as HfSiON, HfSiO, HfON or HfO, or a Zr system oxide such as ZrSiON, ZrSiO, ZrON or ZrO, for example, is used as the High-k material.

On the other hand, the gate insulating film 11 has the property of generating no Fermi level pinning in the metal-containing layer 12a. Here, the property of generating no Fermi level pinning in the metal-containing layer 12a means a property of pinning no Fermi level of the metal-containing layer 12a to the vicinity of the mid gap of Si, and thus does not mean that the Fermi level of the metal-containing layer 12a is not shifted at all.

Although the gate insulating film 11 may also be made of a material, such as $SiO_2$, SiN or SiON, not having essentially a property of generating the Fermi level pinning, for the sake of simplicity of the manufacturing processes, the gate insulating film 11 is preferably made of a material having a suppressed property of generating the Fermi level pinning in the metal-containing layer 12a. In this case, this material is made by implanting an impurity into the same material as that of the gate insulating film 21.

Here, when the material having the property of generating the Fermi level pinning is the Hf system oxide such as HfSiON, HfSiO or HfO, implanting the impurity such as La, Zr or Al into that material makes it possible to suppress the generation of the Fermi level pinning. In addition, when the material having the property of generating the Fermi level pinning is the Zr system oxide such as ZrSiON, ZrSiO or ZrO, implanting the impurity such as La or Al into that material makes it possible to suppress the generation of the Fermi level pinning.

Note that, a structure may also be adopted such that a silicide layer is formed on each of an upper surface of the gate electrode 12, and upper surfaces of the source/drain regions (the semiconductor substrate 2) in the planar type MOSFET 10, and an upper surface of the gate electrode 22, and a surface of the fin 23 in the fin type MOSFET 20.

In order to reduce the threshold voltage, the metal-containing layer 12a of the planar type MOSFET 10 is made of a metal-containing material having a Fermi level near a band edge of Si. However, when the Fermi level pinning is generated in the metal-containing layer 12a, the Fermi level is pinned to the vicinity of the mid gap of Si, which results in that the threshold voltage increases. In order to cope with such a situation, the property of generating the Fermi level pinning in the metal-containing layer 12a is suppressed by implanting the impurity into the gate insulating film 11, thereby suppressing the increase in threshold voltage.

On the other hand, the fin type MOSFET 20 is the fully-depleted transistor and has the double-gate structure. Thus, the responsiveness to the application of the gate voltage is higher in the fin type MOSFET 20 than in the planar type MOSFET 10. For this reason, when the metal-containing layer 22a of the fin type MOSFET 20 is made of the same material as that of the metal-containing layer 12a of the planar type MOSFET 10, that is, the metal-containing material having the Fermi level near the band edge of Si, the threshold voltage is too small, and thus it is feared that the off-state leakage current is caused to flow.

In order to cope with such a situation, the gate insulating film 21 having the property of generating the Fermi level pinning in the metal-containing layer 22a is used in the fin type MOSFET 20 for the purpose of daring the Fermi level pinning to generate in the metal-containing layer 22a, which results in that the Fermi level of the metal-containing layer 22a is pinned to the vicinity of the mid gap of Si, thereby increasing the threshold voltage. As a result, the fin type MOSFET 20 has the preferable threshold voltage.

Hereinafter, an example of processes for manufacturing the semiconductor device 1 according to this embodiment will be described.

FIGS. 3A to 3J are respectively cross sectional views showing processes for fabricating the semiconductor device according to the first embodiment. It is noted that each of the cross sections shown in these figures corresponds to that shown in FIG. 2.

Figure 3A:
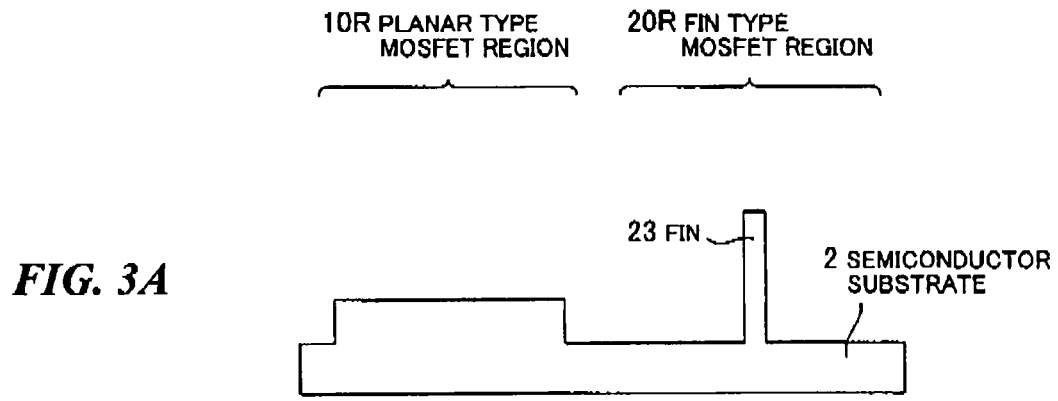
FIGS. 3A to 3J are respectively cross sectional views showing processes for fabricating the semiconductor device according to the first embodiment.

Firstly, as shown in FIG. 3A, the semiconductor substrate 2 is patterned by, for example, utilizing a photolithography technique and a Reactive Ion Etching (RIE) method, thereby forming the fin 23 and a trench for formation of the isolation region 3.

Figure 3B:
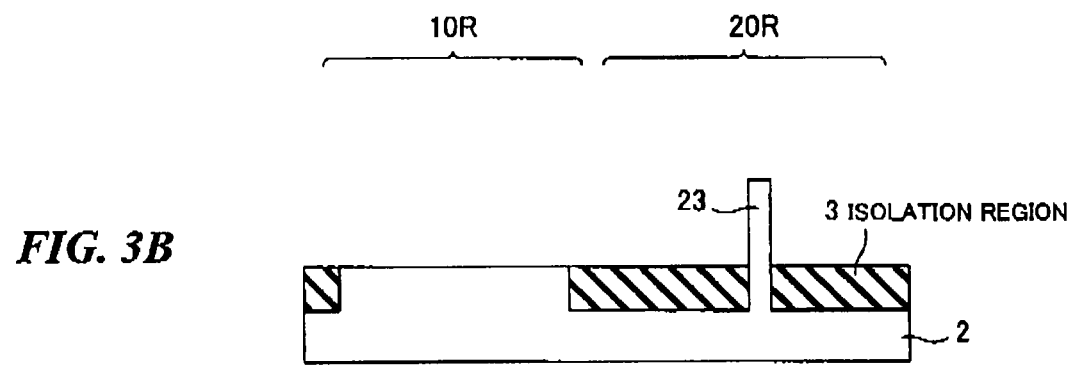

Next, as shown in FIG. 3B, after an oxide film is deposited by utilizing a Chemical Vapor Deposition (CVD) method or the like, it is planarized by performing Chemical Mechanical Polishing (CMP), thereby forming the isolation region 3.

After completion of the formation of the isolation region 3, a conductivity type impurity is implanted into each of a planar type MOSFET region 10R and a fin type MOSFET region 20R by utilizing an ion implantation method, thereby forming a well region (not shown). After that, a heat treatment such as a Rapid Thermal Annealing (RTA) is carried out, thereby activating the conductivity type impurity within the well region.

Here, when an n-channel planar type MOSFET 10 and an n-channel fin type MOSFET 20 are formed, a p-type impurity such as B is implanted as the conductivity type impurity, thereby forming a p-type well region. On the other hand, when a p-channel planar type MOSFET 10 and a p-channel fin type MOSFET 20 are formed, a p-type impurity such as P is implanted as the conductivity type impurity, thereby forming an n-type well region.

Figure 3C:
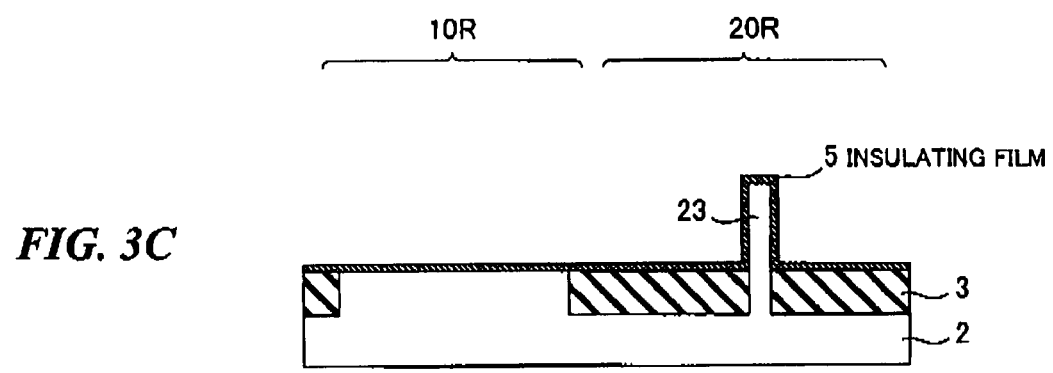

Next, as shown in FIG. 3C, an insulating film 5 is formed so as to cover the surface of the semiconductor substrate 2 in the planar type MOSFET region 10R, and the surface of the fin 23 in the fin type MOSFET region 20R by utilizing the CVD method, a plasma nitriding method or the like. This insulating film is composed of an insulating film, made of a Hf system oxide or the like, having a property of generating the Fermi level pinning in a conductive material adjacent thereto.

Figure 3D:
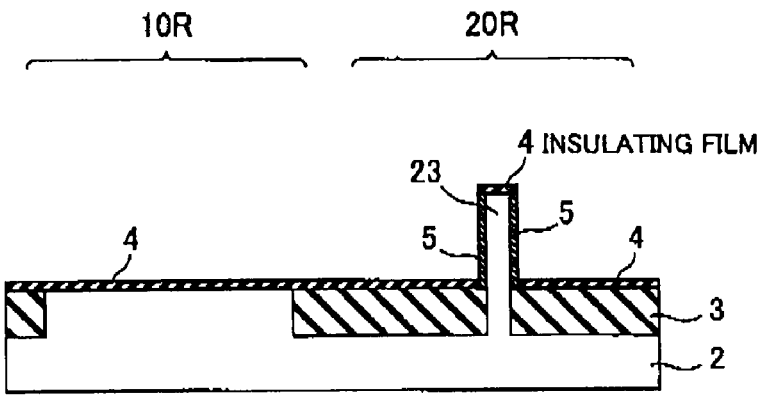

Next, as shown in FIG. 3D, an impurity is implanted into the insulating film 5 in a direction vertical to the surface of the semiconductor substrate 3 by utilizing the ion implantation method or the like. Thus, a portion of the insulating film 5 having the impurity implanted thereinto turns into the insulating film 4. In the insulating film 4, the implantation of the impurity suppresses the property of generating the Fermi level pinning in the conductive material adjacent thereto. It is noted that since the impurity is hardly implanted into a portion of the insulating film 5 corresponding to the side surfaces of the fin 23, the property of the portion of the insulating film 5 corresponding thereto does not change.

It is noted that a process may also be adopted such that a mask is formed on the fin type MOSFET region 20R, and an impurity is selectively implanted into only the insulating film 5 in the planar type MOSFET region 10R by using the mask, thereby forming the insulating film 4. In this case, it is unnecessary to implant the impurity into the insulating film 5 in the direction vertical to the surface of the semiconductor substrate 2.

Figure 3E:
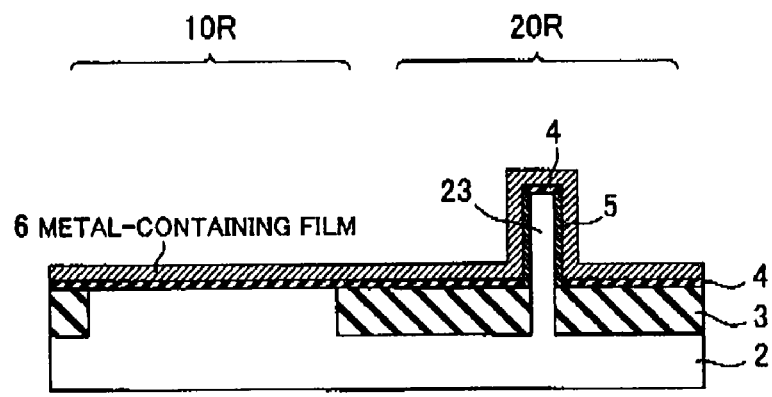

Next, as shown in FIG. 3E, a metal-containing film 6 is formed so as to cover the insulating films 4 and 5 by utilizing the CVD method or the like.

Figure 3F:
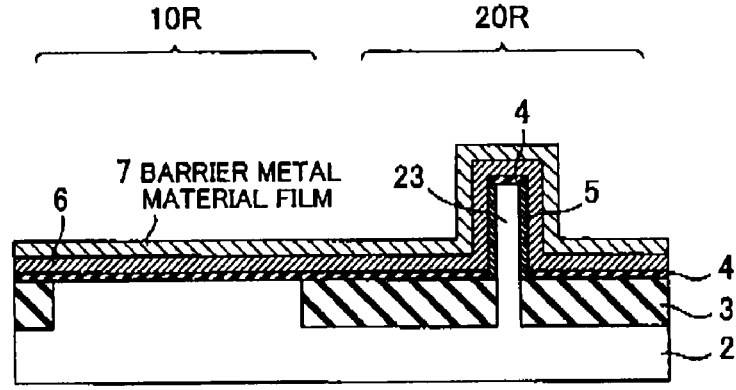

Next, as shown in FIG. 3F, a barrier metal material film 7 is formed on the metal-containing film 6 by utilizing the CVD method or the like.

Figure 3G:
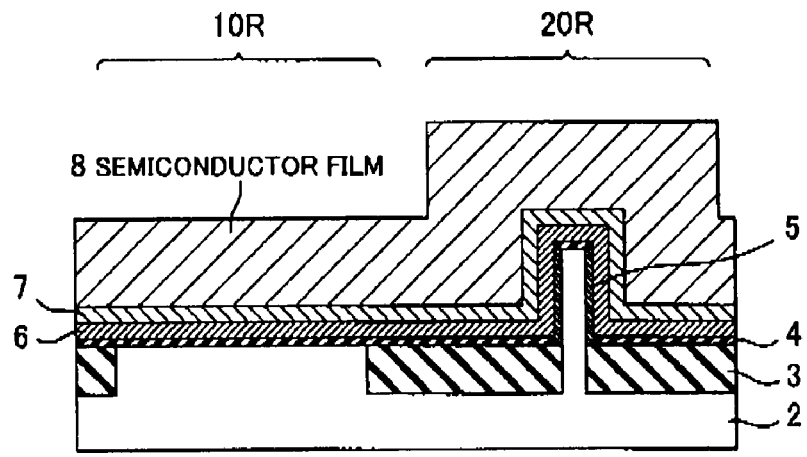

Next, as shown in FIG. 3G, a semiconductor film 8 is formed on the barrier metal material film 7 by utilizing the CVD method or the like.

Figure 3H:
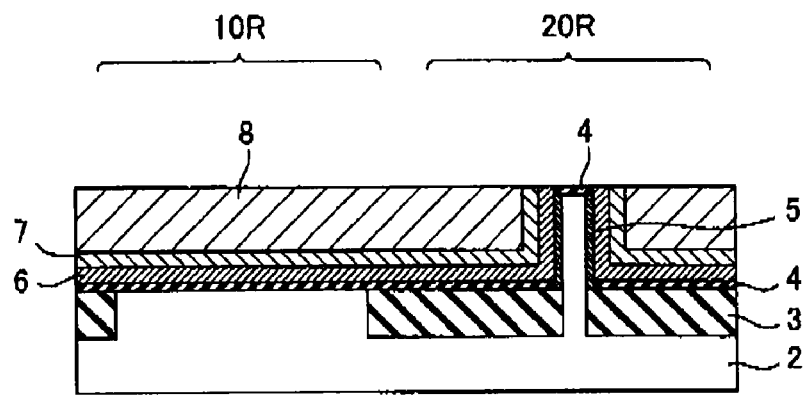

Next, as shown in FIG. 3H, planarization processing such as the CMP is performed for the semiconductor film 8, the barrier metal material film 7, and the metal-containing film 6 by using the insulating film 4 formed on the upper surface of the fin 23 as a stopper.

Figure 3I:
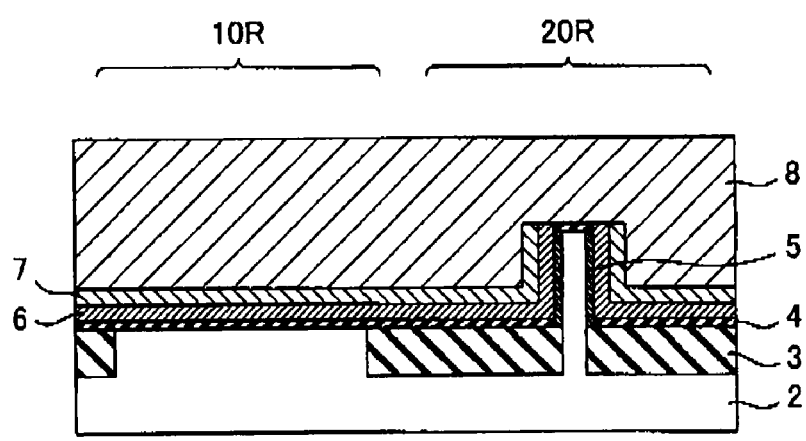

Next, as shown in FIG. 3I, the semiconductor film 8 is further deposited over the entire surface by utilizing the CVD method or the like.

Figure 3J:
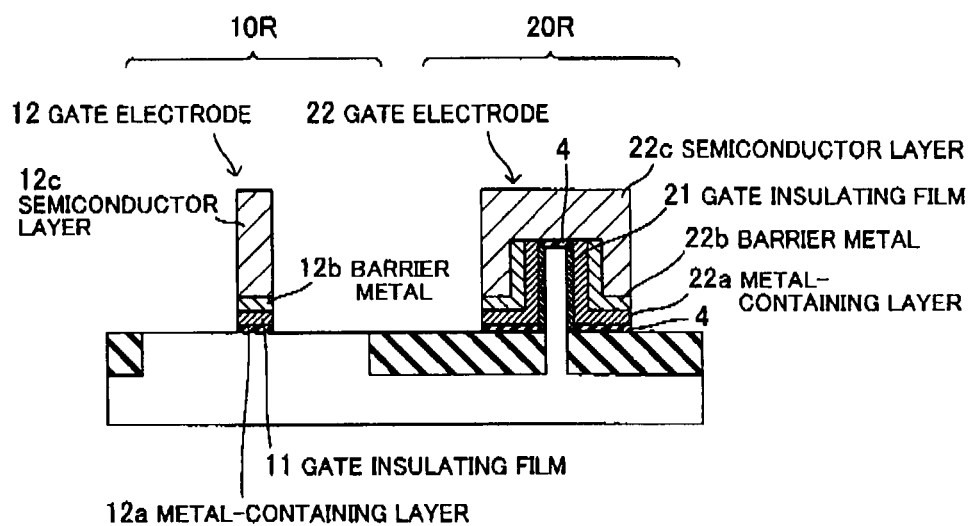

Next, as shown in FIG. 3J, the semiconductor film 8, the barrier metal material film 7, the metal-containing film 6, and the insulating film 4 are patterned by, for example, utilizing the photolithography technique and the RIE method. As a result, in the planar type MOSFET region 10R, the semiconductor film 8, the barrier metal material film 7, the metal-containing film 6, and the insulating film 4 are processed into the semiconductor layer 12c, the barrier metal 12b, the metal-containing layer 12a, and the gate insulating film 11, respectively. On the other hand, in the fin type MOSFET region 20R, the semiconductor film 8, the barrier metal material film 7, and the metal-containing film 6 are processed into the semiconductor layer 22c, the barrier metal 22b, and the metal-containing layer 22a, respectively. In addition, the insulating film 5 formed on each of the side surfaces of the fin 23 is used as the gate insulating film 21.

After that, although not illustrated, exposed portions (portions which are not surrounded by the gate electrode 22) of the insulating films 4 and 5 on the surface of the fin 23 are removed away by performing etching. Next, a conductivity type impurity is implanted into the semiconductor substrate 2 and the fin 23 with the gate electrodes 12 and 22 as a mask by utilizing the ion implantation method or the like, thereby forming extension regions of the source/drain regions in each of the planar type MOSFET 10R and the fin type MOSFET 20R. Here, when the n-channel planar type MOSFET 10 and the n-channel fin type MOSFET 20 are formed, an n-type impurity such as P is implanted as a conductivity type impurity, thereby forming the n-type extension regions. On the other hand, when the p-channel planar type MOSFET 10 and the p-channel fin type MOSFET 20 are formed, a p-type impurity such as B is implanted as a conductivity type impurity, thereby forming the p-type extension regions.

Next, gate sidewalls are formed on sidewalls of the gate electrodes 12 and 22, respectively. Next, a conductivity type impurity is implanted into the semiconductor substrate 2 and the fin 23 with the gate electrodes 12 and 22, and the gate sidewall formed on the side surfaces thereof as a mask by utilizing the ion implantation method or the like, thereby forming source/drain regions in each of the planar type MOSFET region 10R and the fin type MOSFET region 20R. Here, an impurity having the same conductivity type as that of the impurity used to form the extension regions is used as a conductivity type impurity in this case. Next, a metal film is deposited over the planar type MOSFET region 10R and the fin type MOSFET region 20R. Also, a heat treatment is performed for the metal film thus deposited, thereby forming a silicide layer on each of the upper surface of the gate electrode 12, and the upper surfaces of the source/drain regions (the semiconductor substrate 2) in the planar type MOSFET 10, and the upper surface of the gate electrode 22 and the surface of the fin 23 in the fin type MOSFET 20.

In the first embodiment, in the planar type MOSFET 10, the metal-containing layer 12a of the gate electrode 12 has the Fermi level near the band edge of Si, and also the gate insulating film 11 has the property of generating no Fermi level pinning in the metal-containing layer 12a. As a result, the planar type MOSFET 10 has a preferable threshold voltage.

On the other hand, in the fin type MOSFET 20, the metal-containing layer 22a has the Fermi level near the band edge of Si because it is made of the same material as that of the metal-containing layer 12a. However, the gate insulating film 21 has the property of generating the Fermi level pinning in the metal-containing layer 22a. Therefore, the Fermi level of the metal-containing layer 22a is pinned to the vicinity of the mid gap of Si. As a result, the fin type MOSFET 20 has a preferable threshold voltage.

For this reason, according to the first embodiment, the planar type MOSFET 10 and the fin type MOSFET 20 can be given the preferable threshold voltages, respectively, without individually making the metal-containing layer 12a and the metal-containing layer 22a of the different materials, respectively. As a result, it is possible to simplify the manufacturing processes.

In addition, making the metal-containing layer 12a and the metal-containing layer 22a of the same material results in that the processes for peeling off the gate electrode, and replacing the gate electrode thus peeled off with another one in one transistor becomes unnecessary. As a result, it is possible to prevent the gate electrode from being damaged with the peeling-off of the gate electrode.

In addition, since each of the gate insulating film 11 and the gate insulating film 21 is made from the High-k insulating film, each of them is suitable for miniaturization of the semiconductor device 12.

In addition, the gate electrode 12 and the gate electrode 22 has the metal-containing layer 12a and the metal-containing layer 22a, respectively, thereby making it possible to prevent the depletion from being generated in each of the gate electrode 12 and the gate electrode 22.

It is noted that this embodiment is by no means limited to the case where the planar type MOSFET 10 and the fin type MOSFET 20 have the same conductivity type, and thus can also be applied to the case where the planar type MOSFET 10 and the fin type MOSFET 20 have the different conductivity types, respectively. The reason for this is because even when the metal-containing layer 22a of the fin type MOSFET 20 has any of the n or p conductivity type, the generation of the Fermi level pinning pins the Fermi level to the vicinity of the mid gap of Si, thereby giving the fin type MOSFET 20 the threshold voltage suitable therefor.

In addition, although in the above description, no Fermi level pinning is generated in the metal-containing layer 12a, the Fermi level pinning may be generated in the metal-containing layer 12a so as to fall within a range in which the Fermi level pinning generated in the metal-containing layer 12a is weaker than that generated in the metal-containing layer 22a. That is to say, the Fermi level pinning may be generated in the metal-containing layer 12a so as to fall within the range in which an energy difference between the mid gap of Si and the Fermi level pinned to the metal-containing layer 12a is larger than that between the mid gap of Si and the Fermi level pinned to the metal-containing layer 22a.

In this case, for example, the impurity which is contained in the gate insulating film 11 and which serves to suppress the generation of the Fermi level pinning is also contained in a lower concentration than that in the gate insulating film 11 in the gate insulating film 21. For example, in the process for implanting the impurity into the insulating film 5 shown in FIG. 3D, when the implantation angle of the impurity is inclined from the direction vertical to the surface of the semiconductor substrate 2, the impurity is implanted into the insulating film 5 as well formed on each of the side surfaces of the fin 23, so that the insulating film 5 turns into the gate insulating film 21 containing therein the impurity. At this time, an amount of impurity implanted into the insulating film 5 formed on each of the side surfaces of the fin 23 increases and a concentration of the impurity contained in the gate insulating film 21 is close to a concentration of the impurity contained in the gate insulating film 11 as the implantation angle of the impurity is further inclined from the direction vertical to the surface of the semiconductor substrate 2.

Second Embodiment

A second embodiment is different from the first embodiment in that a p-channel planar type MOSFET and an n-channel planar type MOSFET, and a p-channel fin type MOSFET and an n-channel fin type MOSFET are embedded in a semiconductor device 1. It is noted that a description of the same respects as those in the first embodiment is omitted here for the sake of simplicity.

Figure 4:
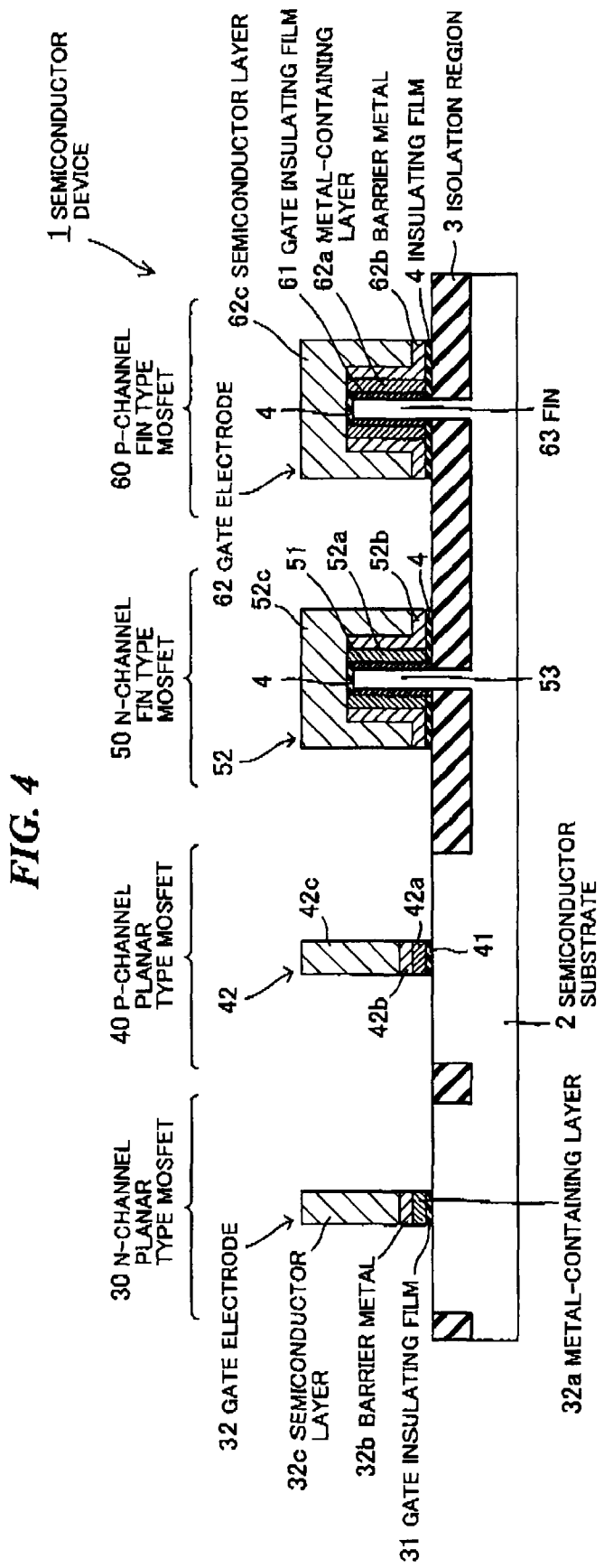
FIG. 4 is a cross sectional view of a semiconductor device according to a second embodiment.

FIG. 4 is a cross sectional view of a semiconductor device according to the second embodiment. It is noted that a cross section shown in FIG. 4 corresponds to that shown in FIG. 2.

The semiconductor device 1 is schematically structured to have an n-channel planar type MOSFET 30 and a p-channel planar type MOSFET 40, and an n-channel fin type MOSFET 50 and a p-channel fin type MOSFET 60 which are formed on the semiconductor substrate 2, and the isolation region 3 for electrically isolating these transistors from one another.

The n-channel planar type MOSFET 30 and the p-channel planar type MOSFET 40 have gate electrodes 32 and 42 which are formed on the semiconductor substrate 2 through gate insulating films 31 and 41, respectively. The gate electrodes 32 and 42 include metal-containing layers 32a and 42a formed on the gate insulating films 31 and 41, barrier metals 32b and 42b formed on the metal-containing layers 32a and 42a, and semiconductor layers 32c and 42c formed on the barrier metals 32b and 42b, respectively. It is noted that although not illustrated, source/drain regions are formed in regions, between which the gate electrodes 32 and 42 are located, respectively, in the vicinities of the surface of the semiconductor substrate 2.

In addition, although not illustrated, well regions may be formed in the regions, of the semiconductor substrate 2, below the n-channel planar type MOSFET 30 and the p-channel planar type MOSFET 40, respectively. In addition, although not illustrated, gate sidewalls or offset spacers may be formed on the side surfaces of each of the gate electrodes 32 and 42, respectively.

The n-channel fin type MOSFET 50 and the p-channel fin type MOSFET 60 include fins 53 and 63 formed on the semiconductor substrate 2, and gate electrodes 52 and 62 formed so as to hold both side surfaces of the fins 53 and 63 between its opposite portions through the gate insulating films 51 and 61, respectively. The gate electrodes 52 and 62 include metal-containing layers 52a and 62a formed on the gate insulating films 52 and 61, barrier metals 52b and 62b formed on the metal-containing layers 52a and 62a, and semiconductor layers 52c and 62c formed on the barrier metals 52b and 62b, respectively. In addition, insulating films 4 are formed between the semiconductor layers 52c and 62c of the gate electrodes 52 and 62, and the upper surfaces of the fins 53 and 63, and between the barrier metals 52b and 62b of the gate electrodes 52 and 62, and the isolation region 3, respectively. It is noted that although not illustrated, source/drain regions are formed in regions, in the fins 53 and 63, which are held between both sides of the gate electrodes 52 and 62, respectively.

In addition, although not illustrated, well regions may be formed in the fins 53 and 63, respectively. Also, although not illustrated, gate sidewalls or offset spacers may be formed on both sides of each of the gate electrodes 52 and 62, respectively.

Each of the gate insulating films 31 and 41, each of the metal layers 32a and 42a, each of the barrier metals 32b and 42b, and each of the semiconductor layers 32c and 42c can be made of the same materials as those of the gate insulating film 11, the metal layer 12a, the barrier metal 12b, and the semiconductor layer 12c in the first embodiment, respectively.

In addition, each of the gate insulating films 51 and 61, each of the metal layers 52a and 62a, each of the barrier metals 52b and 62b, and each of the semiconductor layers 52c and 62c can be made of the same materials as those of the gate insulating film 21, the metal layer 22a, the barrier metal 22b, and the semiconductor layer 22c in the first embodiment, respectively.

It is noted that a structure may also be adopted such that a silicide layer is formed on each of the upper surfaces of the gate electrodes 32 and 42, and the upper surfaces of the source/drain regions (the semiconductor substrate 2) in the n-channel planar type MOSFET 30 and the p-channel planar type MOSFET 40, and each of the upper surfaces of the gate electrodes 52 and 62, and the surfaces of the fins 53 and 63 in the n-channel fin type MOSFET 50 and the p-channel fin type MOSFET 60.

The metal-containing layer 32a can be made of a material, of an n conductivity type, such as TaC or HfB which has the Fermi level near the bottom edge of the conduction band of Si. In addition, the metal-containing layer 42a can be made of a material, of a p conductivity type, such as WN or RuO which has the Fermi level near the top edge of the valence band of Si. In addition, each of the metal-containing layers 32a and 42a may be made of a material which has any of an n or p conductivity type because the generation of the Fermi level pinning pins the Fermi level of each of the metal-containing layers 32a and 42a to the vicinity of the mid gap of Si.

The semiconductor layers 12c and 32c, and 22c and 42c, for example, are made of polycrystalline silicon or polycrystalline silicon germanium containing therein the respective conductivity type impurities. An n-type impurity ion of As, P or the like is used as the conductivity type impurity in each of the semiconductor layers 12c and 32c. In addition, a p-type impurity ion of B, $BF_2$ or the like is used as the conductivity type impurity in each of the semiconductor layers 22c and 42c.

In order to reduce the threshold voltages, the metal-containing layers 32a and 42a of the n-channel planar type MOSFET 30 and the p-channel planar type MOSFET 40 are made of metal-containing materials, respectively, which have the Fermi levels each being near the band edge of Si. However, the generation of the Fermi level pinning in each of the metal-containing layers 32a and 42a pins each of the respective Fermi levels to the vicinity of the mid gap of Si, thereby increasing the respective threshold voltages. In order to cope with such a situation, the properties, in the gate insulating films 31 and 41, of generating the Fermi level pinning in the metal-containing layers 32a and 42a are suppressed by implanting the impurities into the gate insulating films 31 and 41, respectively, thereby suppressing the increase in respective threshold voltages.

On the other hand, the n-channel fin type MOSFET 50 and the p-channel fin type MOSFET 60 are the fully-depleted transistors, and have the double-gate structures, respectively. Thus, the responsiveness to the application of the gate voltage is higher in each of the n-channel fin type MOSFET 50 and the p-channel fin type MOSFET 60 than in each of the n-channel planar type MOSFET 30 and the p-channel planar type MOSFET 40. For this reason, when the metal-containing layers 52a and 62a of the n-channel fin type MOSFET 50 and the p-channel fin type MOSFET 60 are made of the same materials as those of the metal-containing layers 32a and 42a of the n-channel planar type MOSFET 30 and the p-channel planar type MOSFET 40, respectively, that is, the metal-containing materials having the Fermi levels each being near the band edge of Si, the respective threshold voltages are two small, and thus it is feared that the off-state leakage currents are caused to flow.

In order to cope with such a situation, the gate insulating films 51 and 61 having the properties of generating the Fermi level pinning in the metal-containing layers 52a and 62a are used in the n-channel fin type MOSFET 50 and the p-channel fin type MOSFET 60 for the purpose of during the Fermi level pinning to generate in the metal-containing layers 52a and 62a, respectively, which results in that each of the Fermi levels of the metal-containing layers 52a and 62a is pinned to the vicinity of the mid gap of Si, thereby increasing the respective threshold voltages. As a result, the n-channel fin type MOSFET 50 and the p-channel fin type MOSFET 60 have the preferable threshold voltages, respectively.

Hereinafter, an example of processes for manufacturing the semiconductor device 1 according to this embodiment will be described.

FIGS. 5A to 5H are respectively cross sectional views showing processes for fabricating the semiconductor device according to the second embodiment. It is noted that each of the cross sections shown in these figures corresponds to that shown in FIG. 4.

Figure 5A:
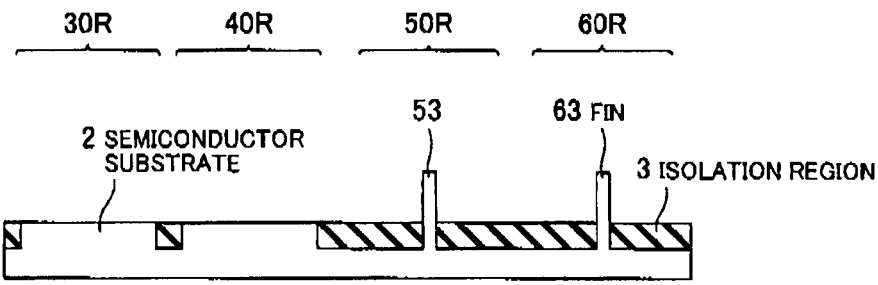
FIGS. 5A to 5H are respectively cross sectional views showing processes for fabricating the semiconductor device according to the second embodiment.

Firstly, as shown in FIG. 5A, the processes until the process, shown in FIG. 3B, for forming the isolation region 3, and the well regions in the predetermined regions are carried out similarly to the case of the first embodiment.

Figure 5B:
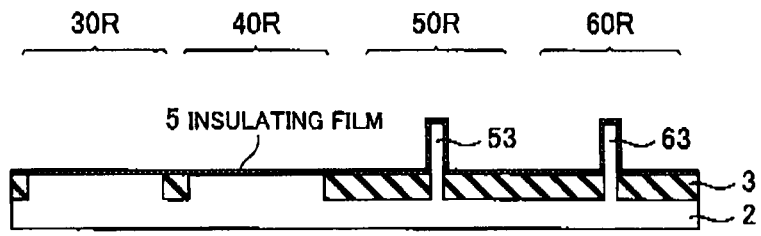

Next, as shown in FIG. 5B, the insulating film 5 is formed so as to cover the surface of the semiconductor substrate 2 in the n-channel planar type MOSFET region 30R and the p-channel planar type MOSFET region 40R, and the surfaces of the fin 53 in the n-channel fin type MOSFET region 50R and the fin 63 in the p-channel fin type MOSFET region 60R by utilizing the CVD method or the like. The insulating film 5 is composed of an insulating film which is made of a Hf system oxide or the like and which has a property of generating the Fermi level pinning in a conductive material adjacent thereto.

Figure 5C:
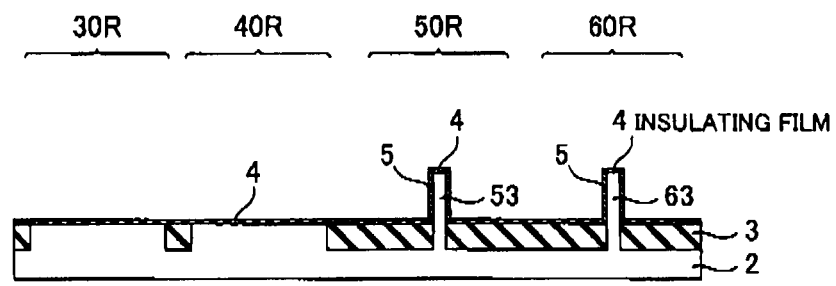

Next, as shown in FIG. 5C, an impurity is implanted into the insulating film 5 in a direction vertical to the surface of the semiconductor substrate 2 by utilizing the ion implantation method or the like. Thus, a portion of the insulating film 5 having the impurity implanted thereto turns into the insulating film 4. In the insulating film 4, the implantation of the impurity suppresses the property of generating the Fermi level pinning in the conductive material adjacent thereto. It is noted that since the impurity is hardly implanted into portions of the insulating film 5 corresponding to the side surfaces of the fins 53 and 63, the property of each of the portions of the insulating film 5 corresponding thereto does not change.

Figure 5D:
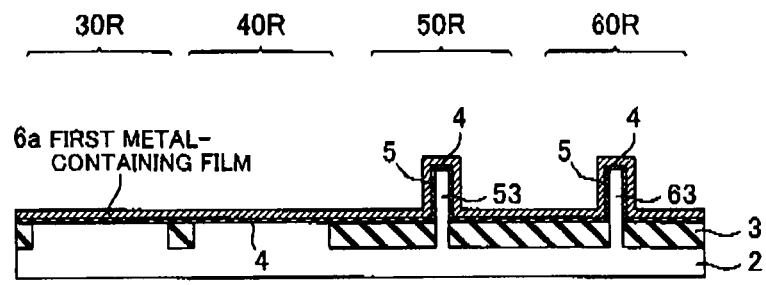

Next, as shown in FIG. 5D, a first metal-containing film 6a is formed so as to cover the insulating films 4 and 5 by utilizing the CVD method or the like.

Figure 5E:
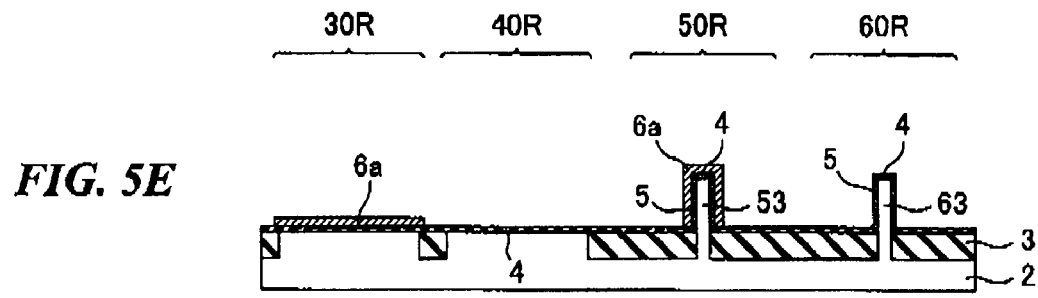

Next, as shown in FIG. 5E, the first metal-containing film 6a is patterned by, for example, utilizing the photolithography technique and the wet etching method, thereby leaving the first metal-containing film 6a only on the semiconductor substrate 2 in the n-channel planar type MOSFET region 30R, and the upper surface and side surfaces of the fin 53 in the n-channel fin type MOSFET region 50R.

Figure 5F:
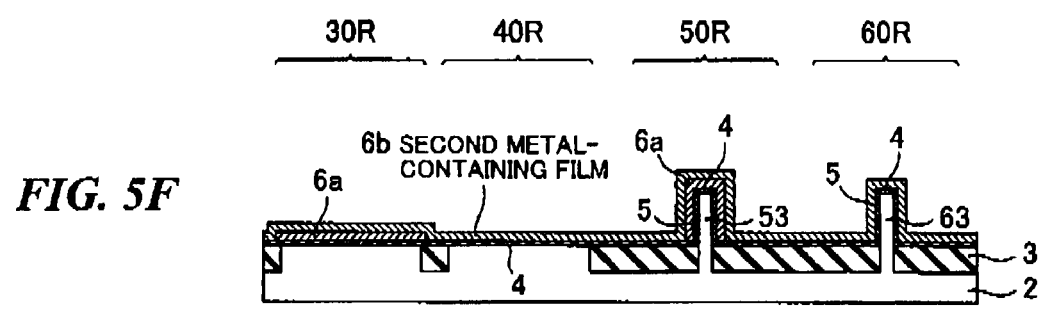

Next, as shown in FIG. 5F, a second metal-containing film 6b is formed so as to cover the insulating films 4 and 5, and the first metal-containing film 6a by utilizing the CVD method or the like.

Figure 5G:
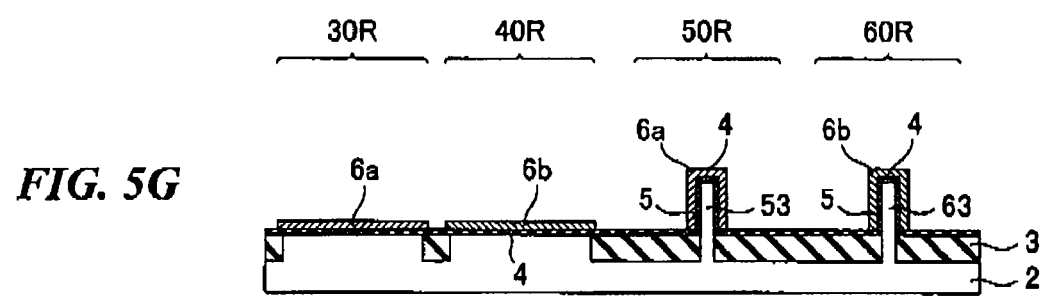

Next, as shown in FIG. 5G, the second metal-containing film 6b is patterned by, for example, utilizing the photolithography technique and the wet etching method, thereby leaving the second metal-containing film 6b only on the semiconductor substrate 2 in the p-channel planar type MOSFET region 40R, and the upper surface and side surfaces of the fin 63 in the p-channel fin type MOSFET region 60R.

Figure 5H:
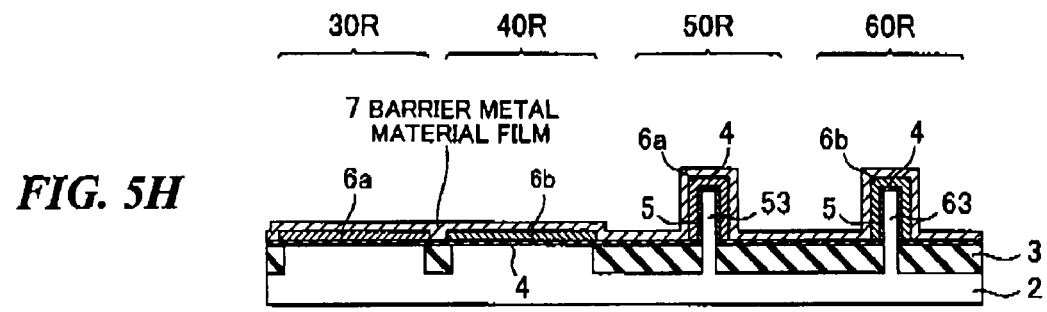

Next, as shown in FIG. 5H, a barrier metal material film 7 is formed so as to cover the first metal-containing film 6a and the second metal-containing film 6b by utilizing the CVD method or the like.

After that, the processes in and after the process for forming the semiconductor film 8 shown in FIG. 5G are carried out similarly to the case in the first embodiment. As a result, in the n-channel planar type MOSFET region 30R, the semiconductor layer 8, the barrier metal material film 7, the first metal-containing film 6a, and the insulating film 4 are processed into the semiconductor layer 32c, the barrier metal 32b, the metal-containing layer 32a, and the gate insulating film 31, respectively. In addition, in the p-channel planar type MOSFET region 40R, the semiconductor layer 8, the barrier metal material film 7, the second metal-containing film 6b, and the insulating film 4 are processed into the semiconductor layer 42c, the barrier metal 42b, the metal-containing film 42a, and the gate insulating film 41, respectively. Also, in the n-channel fin type MOSFET region 50R, the semiconductor layer 8, the barrier metal material film 7, and the first metal-containing film 6a are processed into the semiconductor layer 52c, the barrier metal 52b, and the metal-containing film 52a, respectively. Also, in the p-channel fin type MOSFET region 60R, the semiconductor layer 8, the barrier metal material film 7, and the second metal-containing film 6b are processed into the semiconductor layer 62c, the barrier metal 62b, and the metal-containing film 62a, respectively. Moreover, the insulating films 5 formed on the side surfaces of the fins 53 and 63 are used as the gate insulating films 51 and 61, respectively.

According to the second embodiment, the metal-containing layer 32a of the n-channel planar type MOSFET 30 and the metal-containing layer 52a of the n-channel fin type MOSFET 50, and the metal-containing layer 42a of the p-channel planar type MOSFET 40 and the metal-containing layer 62a of the p-channel fin type MOSFET 60 can be made of the same materials, respectively. As a result, it is possible to simplify the manufacturing processes.

It is noted that the metal-containing layer 52a of the n-channel fin type MOSFET 50 can be made of a material having a p conductivity type, that is, the metal-containing film 6b. The reason for this is because even when the metal-containing layer 52a has any of the n or p conductivity type, the generation of the Fermi level pining pins the Fermi level of the metal-containing layer 52a to the vicinity of the mid gap of Si, thereby giving the n-channel fin type MOSFET 50 the threshold voltage suitable therefor. In addition, from the same reason as that described above, the metal-containing layer 62a of the p-channel fin type MOSFET 60 can be made of a material having the n conductivity type, that is, the first metal-containing film 7.

In addition thereto, it is possible to obtain the sane effects as those in the first embodiment.

In addition, the Fermi level pinning may be generated in each of the metal-containing layers 32a and 42a so as to fall within a range weaker than that of the Fermi level pinning generated in each of the metal-containing layers 52a and 62a. That is to say, the Fermi level pinning may be generated in each of the metal-containing layers 32a and 42a so as to fall within the range in which an energy difference between the mid gap of Si and the Fermi level pinned to each of the metal-containing layers 32a and 42a is larger than that between the mid gap of Si and the Fermi level pinned to each of the metal-containing layers 52a and 62a.

In this case, for example, the impurity which is contained in each of the gate insulating films 31 and 41 and which serves to suppress the generation of the Fermi level pinning is also contained in a lower concentration than that in each of the gate insulating films 31 and 41 in each of the gate insulating films 51 and 61. For example, in the process for implanting the impurity into the insulating film 5 shown in FIG. 5C, when the implantation angle of the impurity is inclined from the direction vertical to the surface of the semiconductor substrate 2, the impurity is implanted into the insulating film 5 as well formed on each of the side surfaces of the fins 53 and 63, so that the insulating film 5 turns into the gate insulating films 51 and 61 each containing therein the impurity. At this time, an amount of impurity implanted into the insulating film 5 formed on each of the side surfaces of the fins 53 and 63 increases and amounts of impurities contained in the gate insulating films 51 and 61 are close to amounts of impurities contained in the gate insulating films 31 and 41, respectively, as the implantation angle of the impurity is further inclined from the direction vertical to the surface of the semiconductor substrate 2.

Third Embodiment

A third embodiment is different from the first embodiment in that a two-layers gate insulating film 11 including a layer having a property of suppressing the Fermi level pinning is used for the purpose of suppressing the property, of the gate insulating film 11, of generating the Fermi level pinning. It is noted that a description of the same respects as those in the first embodiment is omitted here for the sake of simplicity.

Figure 6:
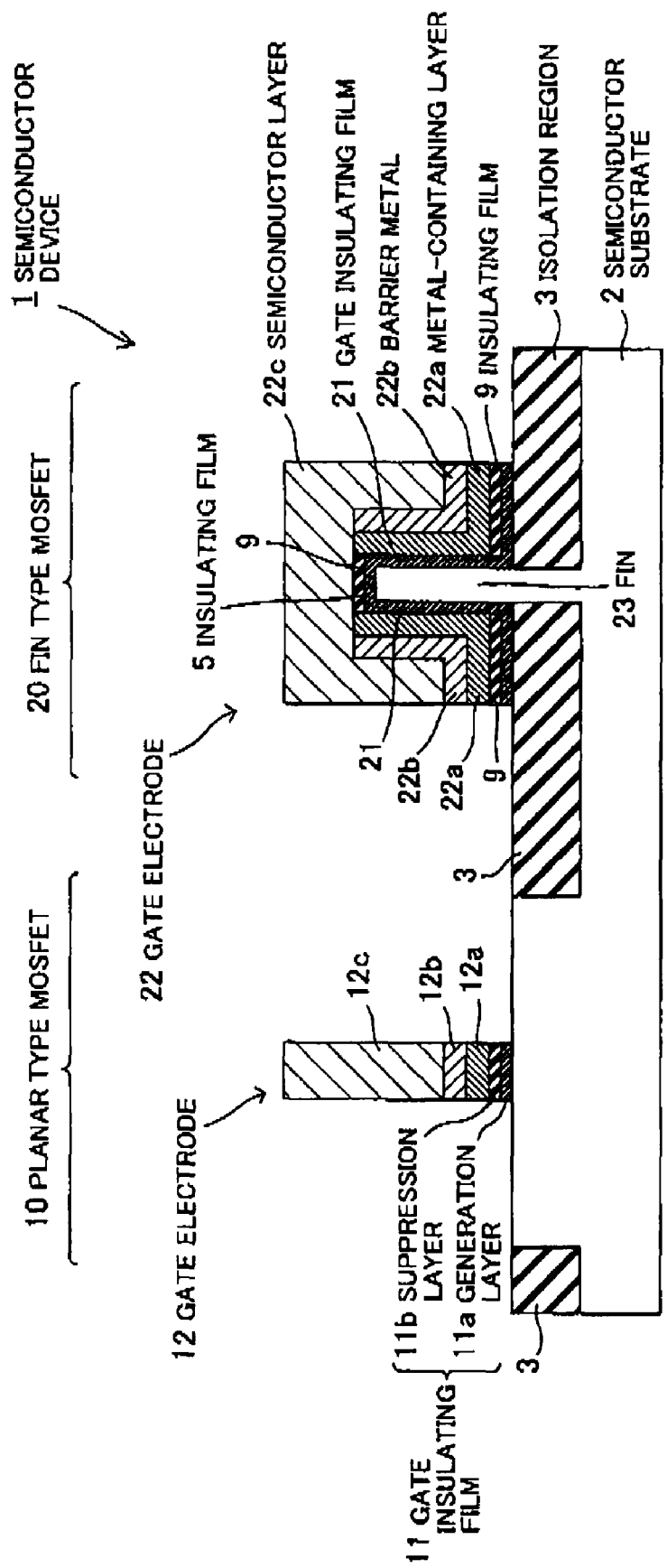
FIG. 6 is a cross sectional view of a semiconductor device according to a third embodiment.

FIG. 6 is a cross sectional view of a semiconductor device according to the third embodiment. It is noted that the cross section shown in FIG. 6 corresponds to that shown in FIG. 2.

A semiconductor device 1 is schematically structured to have a planar type MOSFET 10 and a fin type MOSFET 20 which are formed on a semiconductor substrate 2, and an isolation region 3 through which the planar type MOSFET 10 and the fin type MOSFET 20 are electrically isolated from one another.

The planar type MOSFET 10 has a gate electrode 12 formed on the semiconductor substrate 2 through a gate insulating film 11. The gate electrode 12 includes a metal-containing layer 12a formed on the gate insulating film 11, a barrier metal 12b formed on the metal-containing layer 12a, and a semiconductor layer 12c formed on the barrier metal 12b. It is noted that although not illustrated, source/drain regions are formed in regions, between which the gate electrode 12 is located, in the vicinities of an surface of the semiconductor substrate 2, respectively.

The gate insulating film 11 is composed of a generation layer 11a having a property of generating the Fermi level pinning in the metal-containing layer 12a, and a suppression layer 11b having a property of suppressing the generation of the Fermi level pinning. Although a structure in which the suppression layer 11b is formed on the generation layer 11a is shown in FIG. 6, contrary thereto, a structure may also be adopted such that the generation layer 11a is formed on the suppression layer 11b.

In addition, although not illustrated, a well region may be formed in a region, of the semiconductor substrate 2, below the planar type MOSFET 10. Also, although not illustrated, gate sidewalls or offset spacers may be formed on side surfaces of the gate electrode 12, respectively.

The fin type MOSFET 20 includes a fin 23 formed on the semiconductor substrate 2, and a gate electrode 22 formed so as to hold both side surfaces of the fin 23 between its opposite portions through a gate insulating film 21. The gate electrode 22 includes a metal-containing layer 22a formed on the gate insulating film 21, a barrier metal 22b formed on the metal-containing layer 22a, and a semiconductor layer 22c formed on the barrier metal 22b. In addition, insulating films 5 each of which is the same film as the gate insulating film 21 is formed between the semiconductor layer 22c of the gate electrode 22 and an upper surface of the fin 23, and between the metal-containing layer 22a of the gate electrode 22 and the isolation region 3, respectively. It is noted that although not illustrated, source/drain regions are formed in regions, within the fin 23, between which the gate electrode 22 is located.

In addition, although not illustrated, a well region may be formed in the fin 23. Also, although not illustrated, gate sidewalls or offset spacers may be formed on side surfaces of the gate electrode 22, respectively.

The generation layer 11a of the gate insulating film 11, for example, is made of a High-k material. A Hf system oxide such as HfSiON, HfSiO, HfON or HfO, or a Zr system oxide such as ZrSiON, ZrSiO, ZrON or ZrO, for example, is used as the High-k material. The suppression layer 11b of the gate insulating film 11, for example, is made of a material having a property of shifting the Fermi level in a direction having a polarity opposite to that of a direction of shifting of the Fermi level due to the Fermi level pinning. For example, when the metal-containing layer 12a of the gate electrode 12 has an n conductivity type, since the Fermi level is shifted in a positive direction due to the Fermi level pinning generated in the metal-containing layer 12a, it is possible to use a material, such as Lao or MgO, having a property of shifting the Fermi level in a negative direction. On the other hand, the metal-containing layer 12a of the gate electrode 12 has a p conductivity type, since the Fermi level is shifted in the negative direction due to the Fermi level pinning generated in the metal-containing layer 12a, it is possible to use a material, such as AlO or AlN, having a property of shifting the Fermi level in the positive direction.

Note that, a structure may also be adopted such that a silicide layer is formed on each of an upper surface of the gate electrode 12, and upper surfaces of the source/drain regions (the semiconductor substrate 2) in the planar type MOSFET 10, and an upper surface of the gate electrode 22, and a surface of the fin 23 in the fin type MOSFET 20.

In order to reduce the threshold voltage, the metal-containing layer 12a of the planar type MOSFET 10 is made of a metal-containing material having a Fermi level near a band edge of Si. However, when the Fermi level pinning is generated in the metal-containing layer 12a, the Fermi level is pinned to the vicinity of the mid gap of Si due to the Fermi level pinning, which results in that the threshold voltage increases. In order to cope with such a situation, the property, in the gate insulating film 11, of generating the Fermi level pinning in the metal-containing layer 12a is suppressed by using the suppression layer 11b, thereby suppressing the increase On the other hand, the fin type MOSFET 20 is the fully-depleted transistor and has the double-gate structure. Thus, the responsiveness to the application of the gate voltage is higher in the fin type MOSFET 20 than in the planar type MOSFET 10. For this reason, when the metal-containing layer 22a of the fin type MOSFET 20 is made of the same material as that of the metal-containing layer 12a of the planar type MOSFET 10, that is, the metal-containing material having the Fermi level near the band edge of Si, the threshold voltage is too small, and thus it is feared that the off-state leakage current is generated.

In order to cope with such a situation, the gate insulating film 21 having the property of generating the Fermi level pinning in the metal-containing layer 22a is used in the fin type MOSFET 20 for the purpose of daring the Fermi level pinning to generate in the metal-containing layer 22a, which results in that the Fermi level of the metal-containing layer 22a is pinned to the vicinity of the mid gap of Si, thereby increasing the threshold voltage. As a result, the fin type MOSFET 20 has the preferable threshold voltage.

Hereinafter, an example of processes for manufacturing the semiconductor device 1 according to this embodiment will be described.

Figure 7A:
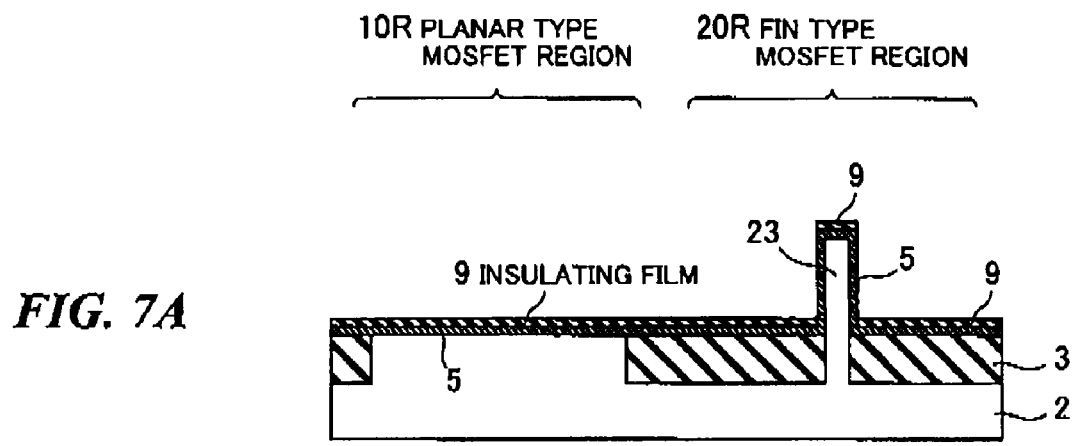
FIGS. 7A and 7B are respectively cross sectional views showing processes for fabricating the semiconductor device according to the third embodiment.
Figure 7B:
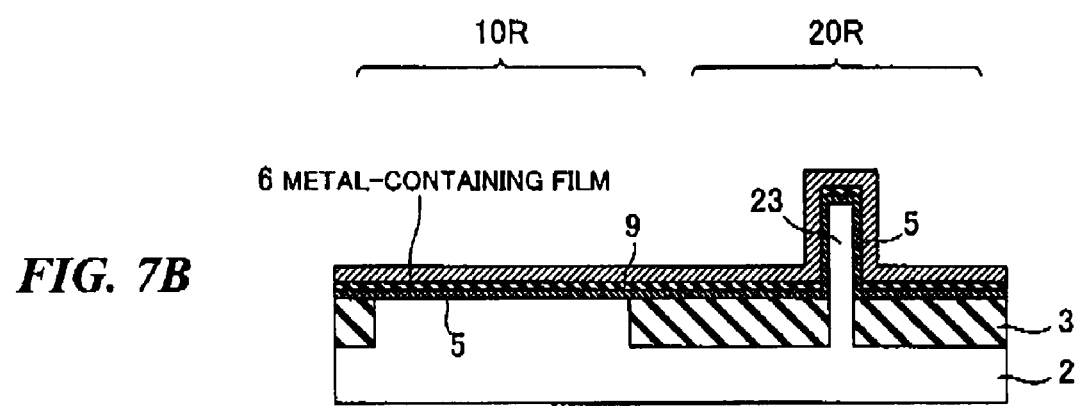

FIGS. 7A and 7B are respectively cross sectional views showing processes for fabricating the semiconductor device according to the third embodiment. It is noted that each of the cross sections shown in these figures corresponds to that shown in FIG. 6.

Firstly, the processes until the process for forming the insulating film 5 by utilizing the CVD method, the plasma nitriding method, and the like shown in FIG. 3C are carried out similarly to the case in the first embodiment.

Next, as shown in FIG. 7A, an insulating film 9 is formed on the insulating film 5. The insulating film 9 is composed of an insulating film having a property of suppressing the property, in the insulating film 5, of generating the Fermi level pinning in the conductive material adjacent thereto.

Here, the insulating film 9 is preferably formed under conditions providing poor coverage by utilizing a sputtering method or the like. The reason for this is because when the insulating film 9 is formed under the conditions providing the poor coverage, it is formed none of the side surfaces of the fin 23, and thus it is unnecessary to remove the insulating film 9 in the fin type MOSFET region 20R in the later process.

It is noted that when the insulating film 9 is formed on each of the side surfaces as well of the fin 23, in order to remove the insulating film 9 formed on each of the side surfaces of the fin 23, the insulating film 9 in the fin type MOSFET region 20R is selectively removed by, for example, utilizing the photolithography technique and the wet etching method.

Next, as shown in FIG. 7B, a metal-containing film 6 is formed so as to cover the insulating films 5 and 9 by utilizing the CVD method or the like.

After that, the processes in and after the process for forming the barrier metal material film 7 so as to cover the metal-containing film 6 shown in FIG. 3F are carried out similarly to the case in the first embodiment 1. As a result, in the planar type MOSFET region 10R, the insulating film 4 and the insulating film 9 are processed into the generation layer 11a and the suppression layer 11b of the gate insulating film 11, respectively.

According to the third embodiment, the gate insulating film 11 of the planar type MOSFET 10 is composed of the two layers of the generation layer 11a and the suppression layer 11b, which results in that the Fermi level pinning can be generated in the metal-containing layer 22a of the fin type MOSFET 20 without generating the Fermi level pinning in the metal-containing layer 12a of the planar type MOSFET 10. As a result, it is possible to obtain the same effects as those in the first embodiment.

It is noted that by combining this embodiment with the second embodiment, this embodiment can be applied to an illustrative embodiment in which p-channel and n-channel planar type MOSFETs, and p-channel and n-channel fin type MOSFETs are embedded in the semiconductor device 1. In this case, each of the gate insulating films of the p-channel and n-channel planar type MOSFETs adopts the two-layers structure including the generation layer and the suppression layer. As a result, the Fermi level pinning is generated in neither of the gate electrodes of the p-channel and n-channel planar type MOSFETs. On the other hand, since the suppression layer is included in neither of the gate insulating films of the p-channel and n-channel fin type MOSFETs, the Fermi level pinning is generated in each of the gate electrodes of the p-channel and n-channel fin type MOSFETs. As a result, the p-channel and n-channel planar type MOSFETs, and the p-channel and n-channel fin type MOSFETs have the threshold voltages suitable for them, respectively.

In addition, although in the above description, no Fermi level pinning is generated in the metal-containing layer 12a, the Fermi level pinning may be generated in the metal-containing layer 12a so as to fall within a range in which the Fermi level pinning generated in the metal-containing layer 12a is weaker than that generated in the metal-containing layer 22a. That is to say, the Fermi level pinning may be generated in the metal-containing layer 12a so as to fall within the range in which an energy difference between the mid gap of Si and the pinned Fermi level of the metal-containing layer 22a is larger than that between the mid gap of Si and the pinned Fermi level of the metal-containing layer 12a.

In this case, for example, a film which is made of the same material as that of the suppression layer 11b and which has the same function as that of the suppression layer is formed, to have a thickness thinner than that of the suppression layer 11b, between the gate insulating film 21 and the metal-containing layer 22a, or between the gate insulating film 21 and the fin 23. For example, when the insulating film 9 is formed under the excellent coverage conditions in the process for forming the insulating film 9 on the insulating film 5 shown in FIG. 7A, the insulating film 9 is formed on each of the side surfaces as well of the fin 23, so that the suppression layer is formed on the gate insulating film 21. At this time, a thickness of the insulating film 9 formed on the insulating film 5 formed on each of the side surfaces of the fin 23 increases and a thickness of the covering layer formed on the gate insulating film 21 is close to that of the suppression layer 11b as the coverage of the insulating film is enhanced.

Fourth Embodiment

A fourth embodiment is different from the first embodiment in that the barrier 12b of the planar type MOSFET 10, and the metal-containing layer 22a of the fin type MOSFET 20 are made of the same material. It is noted that a description of the same respects as those in the first embodiment is omitted here for the sake of simplicity.

Figure 8:
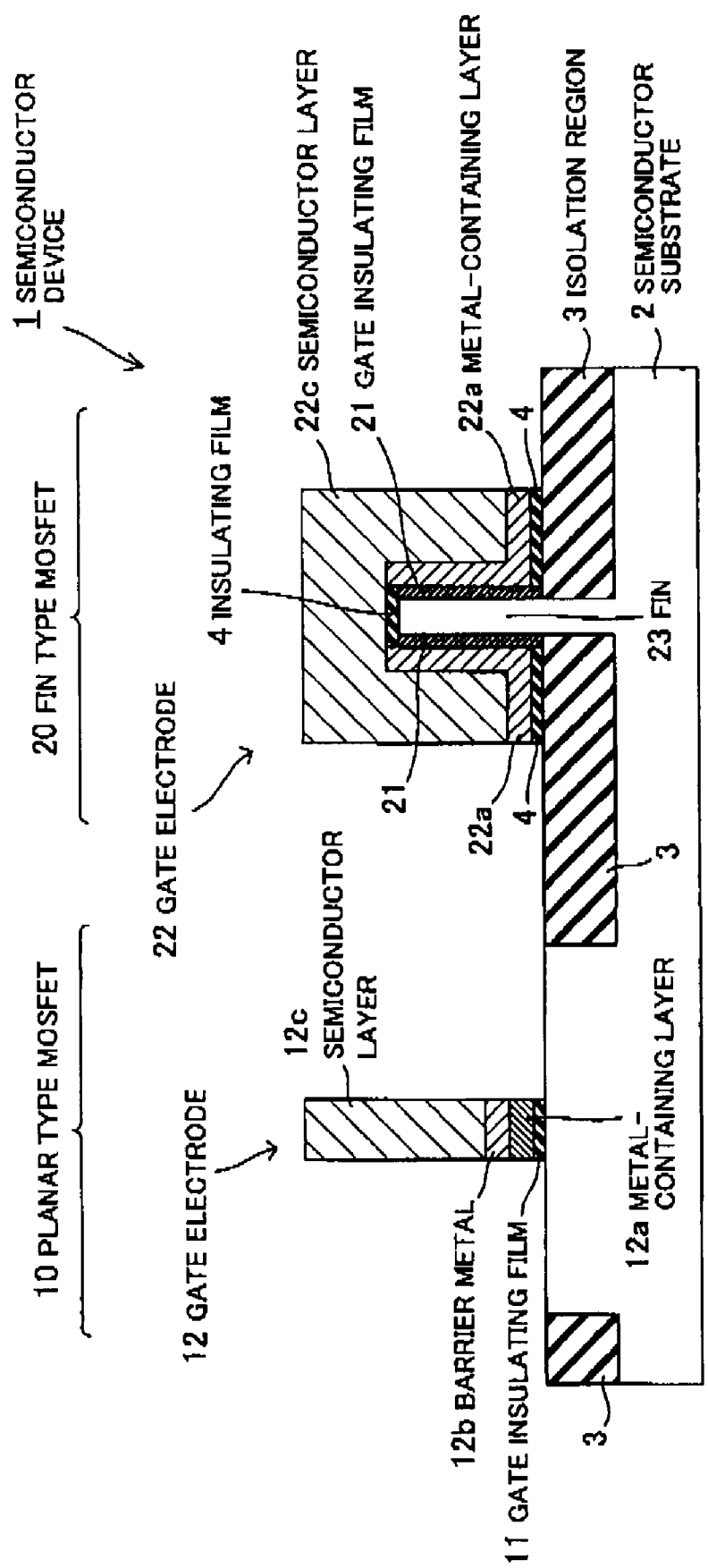
FIG. 8 is a cross sectional view of a semiconductor device according to a fourth embodiment.

FIG. 8 is a cross sectional view of a semiconductor device according to the fourth embodiment. It is noted that the cross section shown in the figure corresponds to that shown in FIG. 2.

A semiconductor device 1 is schematically structured to have a planar type MOSFET 10 and a fin type MOSFET 20 which are formed on a semiconductor substrate 2, and an isolation region 3 through which the planar type MOSFET 10 and the fin type MOSFET 20 are electrically isolated from one another.

The planar type MOSFET 10 has a gate electrode 12 formed on the semiconductor substrate 2 through a gate insulating film 11. The gate electrode 12 includes a metal-containing layer 12a formed on the gate insulating film 11, a barrier metal 12b formed on the metal-containing layer 12a, and a semiconductor layer 12c formed on the barrier metal 12b. It is noted that although not illustrated, source/drain regions are formed in regions, between which the gate electrode 12 is located, in the vicinities of an surface of the semiconductor substrate 2, respectively.

In addition, although not illustrated, a well region may be formed in a region, of the semiconductor substrate 2, below the planar type MOSFET 10. Also, although not illustrated, gate sidewalls or offset spacers may be formed on side surfaces of the gate electrodes 12, respectively.

The fin type MOSFET 20 includes a fin 23 formed on the semiconductor substrate 2, and a gate electrode 22 formed so as to hold both side surfaces of the fin 23 between its opposite portions through a gate insulating film 21. The gate electrode 22 includes a metal-containing layer 22a formed on the gate insulating film 21, and a semiconductor layer 22c formed on metal-containing layer 22a. In addition, insulating films 4 is formed between the semiconductor layer 22c of the gate electrode 22 and an upper surface of the fin 23, and between the metal-containing layer 22a of the gate electrode 22 and the isolation region 3, respectively. It is noted that although not illustrated, source/drain regions are formed in regions, within the fin 23, between which the gate electrode 22 is located.

In addition, although not illustrated, a well region may be formed in the fin 23. Also, although not illustrated, gate sidewalls or offset spacers may be formed on side surfaces of the gate electrode 22, respectively.

Since the metal-containing layer 22a of the fin type MOSFET 20 is made of the same material as that of the barrier metal 12b of the planar type MOSFET 10, there is less the possibility that the metal-containing layer 22a reacts with the semiconductor layer 22c even when contacting the semiconductor layer 22c. It is noted that even when the metal-containing layer 22a has any of the n or p conductivity type, the fin type MOSFET 20 can be given the threshold voltage suitable therefor because the generation of the Fermi level pinning pins the Fermi level of the metal-containing layer 22a to the vicinity of the mid gap of Si.

Note that, a structure may also be adopted such that a silicide layer is formed on each of an upper surface of the gate electrode 12, and upper surfaces of the source/drain regions (the semiconductor substrate 2) in the planar type MOSFET 10, and an upper surface of the gate electrode 22, and a surface of the fin 23 in the fin type MOSFET 20.

Hereinafter, an example of processes for manufacturing the semiconductor device 1 according to this embodiment will be described.

Figure 9A:
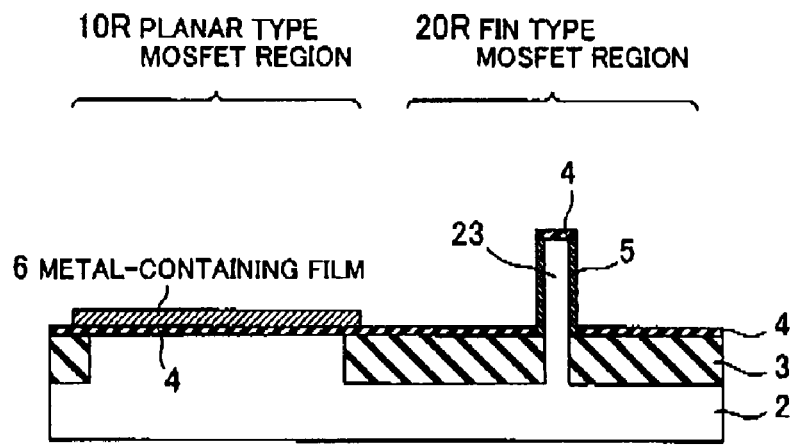
FIGS. 9A to 9C are respectively cross sectional views showing processes for fabricating the semiconductor device according to the fourth embodiment.
Figure 9B:
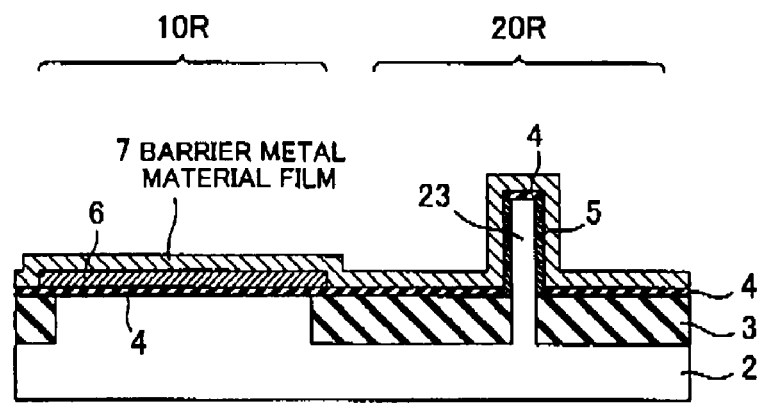
Figure 9C:
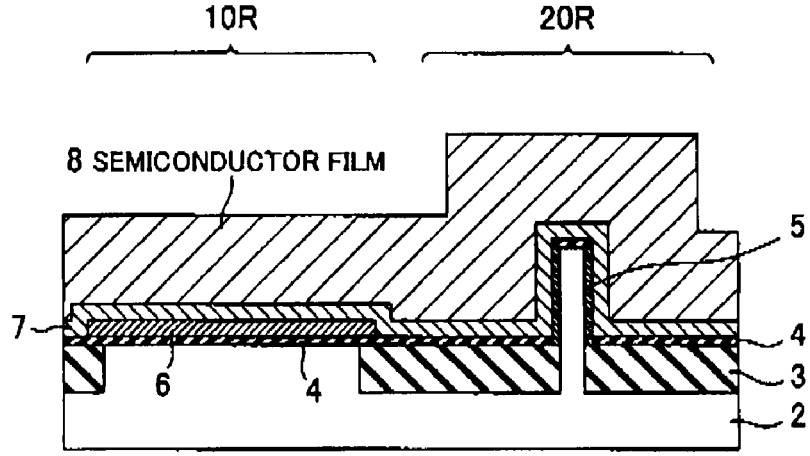

FIGS. 9A to 9C are respectively cross sectional views showing processes for fabricating the semiconductor device according to the fourth embodiment. It is noted that each of the cross sections shown in these figures corresponds to that shown in FIG. 8.

Firstly, the processes until the process for forming the metal-containing film 6 so as to cover the insulating films 4 and 5 shown in FIG. 3E are carried out similarly to the case in the first embodiment.

Next, as shown in FIG. 9A, the metal-containing film 6 is patterned by, for example, utilizing the photolithography technique and the wet etching method, thereby leaving the metal-containing film 6 only in the planar type MOSFET region 10R.

Next, as shown in FIG. 9B, the barrier metal material film 7 is formed so as to cover the insulating films 4 and 5, and the metal-containing film 6 by utilizing the CVD method or the like.

Next, as shown in FIG. 9C, the semiconductor film 8 is formed over the barrier metal material film 7 by utilizing the CVD method or the like.

After that, the processes in and after the process, shown in FIG. 3H, for performing the planarization processing for the semiconductor film 8 and the like by using the insulating film 4 formed on the upper surface of the fin 23 as the stopper are carried our similarly to the case in the first embodiment. As a result, in the planar type MOSFET region 10R, the barrier metal material film 7 is processed into the barrier metal 12b. In addition, in the fin type MOSFET region 20R, the barrier metal material film 7 is processed into the metal-containing layer 22a.

According to the fourth embodiment, making the barrier metal 12b of the planar type MOSFET 10 and the metal-containing layer 22a of the fin type MOSFET 20 of the same material makes it possible to simplify the manufacturing processes.

Note that, when the metal-containing layer 22a of the fin type MOSFET 20 (the barrier metal 12b of the planar type MOSFET 10) has the Fermi level near the mid gap of Si, there is no necessity for generating the Fermi level pinning in the metal-containing layer 22a. Therefore, the gate insulating film 21 of the fin type MOSFET 20 may be made from the insulating film 4 having the impurity implanted thereinto similarly to the case of the gate insulating film 11 of the planar type MOSFET 10. In this case, in the process for implanting the impurity into the insulating film 5 shown in FIG. 3D, the impurity is implanted into the insulating film 5 at a predetermined angle (for example, 30°) with respect to the direction vertical to the surface of the semiconductor substrate 2, which results in that the insulating film 5 formed on each of the side surfaces of the fin 23 is also processed into the insulating film 4.

In addition, when the metal-containing layer 22a of the fin type MOSFET 20 (the barrier metal 12b of the planar type MOSFET 10) has the Fermi level near the mid gap of Si, the gate insulating films 11 and 21 may be made from the insulating films, such as an $SiO_2$ film, each essentially not having the property of generating the Fermi level pinning.

It is noted that by combining this embodiment with the second embodiment, this embodiment can be applied to an illustrative embodiment in which p-channel and n-channel planar type MOSFETs, and p-channel and n-channel fin type MOSFETs are embedded in the semiconductor device 1.

In addition, the Fermi level pinning may be generated in the metal-containing layer 12a so as to fall within a range in which the Fermi level pinning generated in the metal-containing layer 12a is weaker than that generated in the metal-containing layer 22a. That is to say, the Fermi level pinning may be generated in the metal-containing layer 12a so as to fall within the range in which an energy difference between the mid gap of Si and the Fermi level pinned to the metal-containing layer 12a is larger than that between the mid gap of Si and the Fermi level pinned to the metal-containing layer 22a.

In this case, for example, the impurity which is contained in the gate insulating film 11 and which serves to suppress the generation of the Fermi level pinning is also contained in the gate insulating film 21 in a lower concentration than that in the gate insulating film 11.

Other Embodiments

The present invention is by no means limited to the embodiments described above, and various changes can be made without departing from the gist of the invention.

In addition, the constituent elements of the embodiments described above can be arbitrarily combined with one another without departing from the gist of the invention.

What is claimed is:

1. A semiconductor device, comprising:
   a fin type MOSFET including a first gate electrode, and a first gate insulating film for generating Fermi level pinning in the first gate electrode; and
   a planar type MOSFET including a second gate electrode, and a second gate insulating film for generating no Fermi level pinning in the second gate electrode, or generating Fermi level pinning weaker than that generated in the first gate electrode in the second gate electrode;
   wherein the second gate insulating film is a film obtained by implanting an impurity in a predetermined concentration into a second insulating film for generating Fermi level pinning in the second gate electrode;
   the first gate insulating film is either a first insulating film made of the same material as that of the second insulating film, or a film obtained by implanting the impurity in a lower concentration than the predetermined concentration into the first insulating film,
   each of the first and second insulating films is made of a High-k material;
   the High-k material is a Hf system oxide or a Zr system oxide; and when the High-k material is the Hf system oxide, at least one of La and Zr is used as the impurity, and when the High-k material is the Zr system oxide, at least one of La and Al is used as the impurity.

2. The semiconductor device according to claim 1, wherein the first gate electrode includes a first metal-containing layer containing therein a metal and contacting the first gate insulating film; and
the second gate electrode includes a second metal-containing layer containing therein a metal and contacting the second gate insulating film.

3. The semiconductor device according to claim 2, wherein the first metal-containing layer and the second metal-containing layer are made of the same material.

4. The semiconductor device according to claim 3, wherein the planar type MOSFET and the fin type MOSFET have different conductivity types, respectively.

5. The semiconductor device according to claim 3, wherein the semiconductor device comprises:
the planar type MOSFET and the fin type MOSFET having the same conductivity type;
another fin type MOSFET including a third gate electrode, and a third gate insulating film for generating Fermi level pinning in the third gate electrode, and having a conductivity type different from that of the fin type MOSFET; and
another planar type MOSFET including a fourth gate electrode, and a fourth gate insulating film for generating no Fermi level pinning in the fourth gate electrode, or generating Fermi level pinning weaker than that generated in the third gate electrode, and having a conductivity type different from that of the planar type MOSFET; and
the third gate electrode includes a third metal-containing layer containing therein a metal and contacting the third gate insulating film; and
the fourth gate electrode includes a fourth metal-containing layer which is made of the same material as that of the third metal-containing layer and which contacts the fourth gate insulating film.

6. A semiconductor device, comprising:
a fin type MOSFET including a first gate electrode, and a first gate insulating film for generating Fermi level pinning in the first gate electrode; and
a planar type MOSFET including a second gate electrode, and a second gate insulating film for generating no Fermi level pinning in the second gate electrode, or generating Fermi level pinning weaker than that generated in the first gate electrode in the second gate electrode;
wherein the second gate insulating film has a second generation layer for generating the Fermi level pinning in the second gate electrode, and a second suppression layer for shifting a Fermi level of the second gate electrode in a direction of canceling the Fermi level pinning generated by the second generation layer;
the first gate insulating film has either a first generation layer made of the same material as that of the second generation layer, or the first generation layer and a first suppression layer which is made of the same material as that of the second suppression layer and which is thinner than the second suppression layer;
each of the first and second insulating films is made of a High-k material;
the High-k material is a Hf system oxide or a Zr system oxide; and
when the High-k material is the Hf system oxide, each of the first and second suppression layers contains therein at least one of LaO and MgO, and when the High-k material is the Zr system oxide, each of the first and second suppression layers contains therein at least one of LaO, MgO, AlO or AlN.

7. The semiconductor device according to claim 6, wherein the first gate electrode includes a first metal-containing layer containing therein a metal and contacting the first gate insulating film; and
the second gate electrode includes a second metal-containing layer containing therein a metal and contacting the second gate insulating film.

8. The semiconductor device according to claim 7, wherein the first metal-containing layer and the second metal-containing layer are made of the same material.

9. The semiconductor device according to claim 8, wherein the planar type MOSFET and the fin type MOSFET have different conductivity types, respectively.

10. The semiconductor device according to claim 8, wherein the semiconductor device comprises:
the planar type MOSFET and the fin type MOSFET having the same conductivity type;
another fin type MOSFET including a third gate electrode, and a third gate insulating film for generating Fermi level pinning in the third gate electrode, and having a conductivity type different from that of the fin type MOSFET; and
another planar type MOSFET including a fourth gate electrode, and a fourth gate insulating film for generating no Fermi level pinning in the fourth gate electrode, or generating Fermi level pinning weaker than that generated in the third gate electrode, and having a conductivity type different from that of the planar type MOSFET; and
the third gate electrode includes a third metal-containing layer containing therein a metal and contacting the third gate insulating film; and
the fourth gate electrode includes a fourth metal-containing layer which is made of the same material as that of the third metal-containing layer and which contacts the fourth gate insulating film.

11. A semiconductor device, comprising:
a fin type MOSFET including a first gate insulating film, and a first gate electrode including a first metal-containing layer formed on the first gate insulating film, and a first semiconductor layer formed on the first metal-containing layer; and
a planar type MOSFET including a second gate insulating film made of the same material as that of the first insulating film, and a second gate electrode including a second metal-containing layer formed on the second gate insulating film, a barrier metal made of the same material as that of the first metal-containing layer and formed on the second metal-containing layer, and a second semiconductor layer formed on the barrier metal.

12. The semiconductor device according to claim 11, wherein the first gate insulating film has a property of generating Fermi level pinning in the first gate electrode; and
the second gate insulating film has a property of generating no Fermi level pinning in the second gate electrode, or generating the Fermi level pinning weaker than that generated in the first gate electrode.

13. A method of fabricating a semiconductor device, comprising:
processing a semiconductor substrate, thereby forming a planar type MOSFET region and a fin type MOSFET region having a fin;
forming an insulating film having a property of generating Fermi level pinning in a conductive material B adjacent thereto on each of the planar type MOSFET region and the fin type MOSFET region;

making the property of a portion of the insulating film formed on the planar type MOSFET region weaker than that of a portion of the insulating film formed on each of side surfaces of the fin of the fin type MOSFET region;

forming a gate material film on the insulating film formed on each of the planar type MOSFET region and the fin type MOSFET region; and processing the insulating film and the gate material film on the planar type MOSFET region and the fin type MOSFET region, thereby forming gate insulating films and the gate electrode in the planar type MOSFET region and the fin type MOSFET region, respectively, wherein the property of a portion of the insulating film formed in the planar type MOSFET region is made weaker than that of a portion formed on each of side surfaces of the fin in the fin type MOSFET region by implanting an impurity into the portion of the insulating film formed in the planar type MOSFET region;

the insulating film is made of a Hf system oxide or a Zr system oxide; and when the insulating film is made of the Hf system oxide, at least one of La and Zr is used as the impurity, and when the insulating film is made of the Zr system oxide, at least one of La and Al is used as the impurity.

14. The method of fabricating a semiconductor device according to claim 13, wherein the implantation of the impurity is carried out in a direction vertical to a surface of the semiconductor substrate by utilizing an ion implantation method so that an amount of impurity implanted into the insulating film formed on each of the side surfaces of the fin is less.

15. A method of fabricating a semiconductor device, comprising:

processing a semiconductor substrate, thereby forming a planar type MOSFET region and a fin type MOSFET region having a fin;

forming an insulating film having a property of generating Fermi level pinning in a conductive material B adjacent thereto on each of the planar type MOSFET region and the fin type MOSFET region;

making the property of a portion of the insulating film formed on the planar type MOSFET region weaker than that of a portion of the insulating film formed on each of side surfaces of the fin of the fin type MOSFET region;

forming a gate material film on the insulating film formed on each of the planar type MOSFET region and the fin type MOSFET region; and processing the insulating film and the gate material film on the planar type MOSFET region and the fin type MOSFET region, thereby forming gate insulating films and the gate electrode in the planar type MOSFET region and the fin type MOSFET region, respectively, wherein the property of a portion of the insulating film formed in the planar type MOSFET region is made weaker than that of a portion of the insulating film formed on each of the side surfaces of the fin in the fin type MOSFET region by forming another insulating film having a property of suppressing the property of the insulating film on the portion of the insulating film formed in the planar type MOSFET region;

the insulating film is made of a Hf system oxide or a Zr system oxide; and when the insulating film is made of the Hf system oxide, the another insulating film contains therein at least one of LaO and MgO, and when the insulating film is made of the Zr system oxide, the another insulating film contains therein at least one of LaO, MgO, AlO and AlN.

16. The method of fabricating a semiconductor device according to claim 15, wherein the formation of the another insulating film is carried out under poor coverage conditions so that a thickness of the another insulating film in each of the side surfaces of the fin is thinner than that of the another insulating film in the planar type MOSFET.

* * * * *